United States Patent
Inoue et al.

(10) Patent No.: US 7,420,215 B2
(45) Date of Patent: Sep. 2, 2008

(54) TRANSPARENT CONDUCTIVE FILM, SEMICONDUCTOR DEVICE AND ACTIVE MATRIX DISPLAY UNIT

(75) Inventors: Kazunori Inoue, Tokyo (JP); Nobuaki Ishiga, Kumamoto (JP); Kensuke Nagayama, Kumamoto (JP); Toru Takeguchi, Tokyo (JP); Kazumasa Kawase, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 11/767,217

(22) Filed: Jun. 22, 2007

(65) Prior Publication Data

US 2008/0012016 A1  Jan. 17, 2008

(30) Foreign Application Priority Data

Jun. 30, 2006 (JP) .............................. 2006-181061

(51) Int. Cl.
| | |
|---|---|
| H01L 29/04 | (2006.01) |
| H01L 29/15 | (2006.01) |
| H01L 31/036 | (2006.01) |
| H01L 29/10 | (2006.01) |
| H01L 31/0376 | (2006.01) |
| H01L 31/20 | (2006.01) |
| H01L 31/00 | (2006.01) |
| H01L 23/48 | (2006.01) |
| H01L 23/52 | (2006.01) |
| H01L 29/40 | (2006.01) |

(52) U.S. Cl. .................... 257/72; 257/59; 257/449; 257/450; 257/451; 257/452; 257/453; 257/454; 257/455; 257/456; 257/457; 257/749

(58) Field of Classification Search ................. 257/59, 257/72, 449–457, 749
See application file for complete search history.

(56) References Cited

U.S. PATENT DOCUMENTS

| | | | |
|---|---|---|---|
| 6,016,174 A | 1/2000 | Endo et al. ............... 349/43 |
| 6,297,519 B1 | 10/2001 | Fujikawa et al. .......... 257/59 |
| 6,533,965 B1 | 3/2003 | Sasaki et al. ............ 252/519.5 |
| 2003/0148871 A1 | 8/2003 | Inoue ........................ 501/134 |
| 2004/0004686 A1 | 1/2004 | Ogawa et al. ............. 349/114 |
| 2005/0184395 A1 | 8/2005 | Gotoh et al. ............... 257/765 |
| 2006/0169317 A1* | 8/2006 | Sato et al. ................. 136/256 |
| 2006/0238110 A1* | 10/2006 | Shirai et al. ............... 313/503 |
| 2006/0261333 A1* | 11/2006 | Murakami et al. ......... 257/40 |
| 2007/0103055 A1* | 5/2007 | Tomai et al. .............. 313/503 |

FOREIGN PATENT DOCUMENTS

| | | |
|---|---|---|
| JP | 10-268353 | 10/1998 |
| JP | 2000-72537 | 3/2000 |
| JP | 2000/77666 | 3/2000 |
| JP | 2000-155341 | 6/2000 |

(Continued)

*Primary Examiner*—Ida M Soward
(74) *Attorney, Agent, or Firm*—Oblon, Spivak, McClelland, Maier & Neustadt, P.C.

(57) ABSTRACT

A transparent conductive film substantially made from $In_2O_3$, $SnO_2$ and ZnO, having a molar ratio In/(In+Sn+Zn) of 0.65 to 0.8 and also a molar ratio Sn/Zn of 1 or less: The transparent conductive film has a favorable electric contact property with an electrode or line made from Al or Al alloy film. Further, a semiconductor device having an electrode or line made from the transparent conductive film has high reliability and productivity.

9 Claims, 16 Drawing Sheets

FOREIGN PATENT DOCUMENTS

| | | |
|---|---|---|
| JP | 2000-185968 | 7/2000 |
| JP | 2000-256059 | 9/2000 |
| JP | 2000/256061 | 9/2000 |
| JP | 2000-330134 | 11/2000 |
| JP | 2001-155549 | 6/2001 |
| JP | 2001-318389 | 11/2001 |
| JP | 2003/255378 | 9/2003 |
| JP | 2004-214606 | 7/2004 |
| JP | 2004/294804 | 10/2004 |

* cited by examiner

US 7,420,215 B2

TRANSPARENT CONDUCTIVE FILM, SEMICONDUCTOR DEVICE AND ACTIVE MATRIX DISPLAY UNIT

BACKGROUND OF THE INVENTION

1. Field of the Invention

The present invention relates to a transparent conductive film, semiconductor device and active matrix display unit.

2. Description of Related Art

Recent years in the field of display unit using a semiconductor device, flat panel display units including liquid crystal displays and Electro Luminescence display units characterized by energy and space saving are rapidly expanding to take place conventional CRTs. In these display units, several electrodes, wirings and devices are provided on a substrate. Specifically, an active matrix type TFT array substrate including switching devices such as a thin-film transistor (TFT) having a scanning and signal lines, a gate electrode and source/drain electrode are provided in array for applying an independent video signal to electrodes of each display pixel are becoming to be common.

An active matrix type TFT array substrate used in a liquid crystal display is disclosed in Japanese Unexamined Patent Application Publication No. 10-268353. The active matrix type TFT array substrate includes a metal film for forming an electrode and wiring and a transparent conductive layer for forming a pixel electrode and input/output terminal unit of a video signal. ITO and IZO or the like is used for the transparent conductive layer. In general, there are a plurality of connectors provided in which the metal films and the transparent electrode layers are electrically connected.

Further, there is a problem in signal delays caused by longer scanning and signal lines and smaller line width thereof associated with a larger and highly-defined liquid crystal display. To prevent such problem, materials of electrodes and lines are desired to have low resistance electrically such as Al. However, if using Al for metal films, a favorable electric contact characteristic with a transparent electrode layer including ITO and IZO or the like cannot be obtained. Therefore as disclosed in Japanese Unexamined Patent Application Publication No. 2000-77666, generally a method has been used in which a high-melting point metal film such as Ti, Cr and Mo is formed in the connectors between the metal and transparent electrode films to obtain a favorable electric contact characteristic between Al film and the transparent electrode layer through the high-melting point metal film.

Further as a reflecting electrode to display images by reflecting light, there are display units using a pixel electrode made from Al or Al alloy film. For example in a reflective type liquid crystal display, to match with the standard potential of an opposing electrode made from an ITO film, an ITO or IZO film is formed on a pixel electrode acting also as a reflecting electrode that is made from Al or Al alloy film (see Japanese Unexamined Patent Application Publication No. 2004-294804). In an organic EL display unit, to improve the efficiency of injecting charge from an anode pixel electrode to an organic EL light-emitting device, an ITO or IZO film having high work function is formed on a pixel electrode acting also as a reflecting electrode that is made from Al or Al alloy film. In these display units, an ITO or IZO film must be directly formed on an Al or Al alloy film in order to utilize the high optical reflectance of the Al or Al alloy film.

However, to form a film by laminating Al and high-melting point metal film as in Japanese Unexamined Patent Application Publication No. 2000-77666, depending on the kind of the high-melting point metal layer, an edge part of the laminated layer line pattern could be an inverse taper or an appentice shape due to a difference of corrosion potentials in etchant of a etching process for patterning, and thus it has been a problem that a coverage failure is generated in a film formed in a upper layer.

Further, an ITO film directly formed on the Al or Al ally film is polycrystal. As polycrystal ITO is chemically stable, it is patterned using strongly acidic solution of aqua regia system. However, there is a problem of using such strong acidic solution that the underlying Al or Al ally film is etched. On the other hand to prevent this, there is another method to use weak acid solution. In such case, the ITO film is amorphous. An amorphous ITO film is formed by sputtering method in gas mixed with Ar and $H_2O$ or $H_2$. However, when mixing $H_2O$ or $H_2$, dust is generated in the sputtering and mixed in the ITO film as foreign matter, thus decreasing yield. Furthermore as the amorphous ITO film is crystallized by heating of approx. 150 degree Celsius, it is partially crystallized in a post baking process (generally from 140 to 160 degree Celsius) of a resist patterning for a photolithography process. There is a problem that the ITO crystal grains become etching residue and thereby decreases the yield.

On the other hand, an IZO film directly formed on the Al or Al alloy film is amorphous. As the Amorphous IZO film is formed by a sputtering method not mixing $H_2O$ or $H_2$ but only using Ar gas, the abovementioned problem of dust is not created. Furthermore, as the amorphous IZO film is not crystallized even after a post baking process, the above problem of etching residue is not created. However, the IZO film is difficult to crystallize conversely and has poor acid resistance. If an etching by acid chemical or cleansing process is required after forming an IZO film pattern, it may be corroded and deteriorated reliability, thus creating a problem that an incorporation of the IZO film to a device is seriously limited.

SUMMARY OF THE INVENTION

The present invention is made to solve the above problems and an object of the present invention is to provide a semiconductor device that is able to directly contact an electrode or a line made from a metal film with a transparent electrode layer and also have high reliability and productivity.

According to an embodiment of the present invention, there is provided a transparent conductive film substantially made from $In_2O_3$, $SnO_2$ and ZnO, having a molar ratio In/(In+Sn+Zn) of 0.65 to 0.8 and also a molar ratio Sn/Zn of 1 or less.

According to an embodiment of the present invention, an electrode or line made from Al or Al alloy film can be directly contacted with the transparent conductive layer and a semiconductor device with high productivity can be provided.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

The main reason that a favorable contact characteristic cannot be obtained in electric connectors between a conventional Al and ITO or IZO film is thought to be because an oxide $AlO_x$ of Al having electric insulating properties over interfaces of both films (for example see "Evaluation of ITO/AlN Interface Reflection Layer by XPS", Extended Abstracts of the 47th Meeting of the Japan Society of Applied Physics (held in March 2003 at Aoyama Gakuin University), 31a-YA-9, pp 866, 2000.). The inventors tentatively formed a metal Al film of approx. 200 nm thickness and an ITO film of approx. 100 nm thickness by sputtering method and closely examined around its interfaces using the Auger electron spectroscopy analysis method, X-ray photoelectron spectroscopy, and transmission electron microscope. Consequently, $AlO_x$ of approx. 5 to 10 nm thickness is formed as a uniform layer and the inventors confirmed that this blocks electric conductivity. These phenomena also occur when forming an IZO film instead of the ITO film.

On the other hand, a contact resistance value between an ITZO and Al films has found out to be low. As a result of an interface structure of the films, metal elements constituting the ITZO exist as non-oxidized metal substance by the existence of Zn and an electrical conductive path is formed by the metal elements. Incidentally, not only for the ITZO and Al films, with a low contact resistance value of the transparent electrode film and metal, it has been found out to include a similar interface structure.

Further, the inventors have found out from investigations that by optimizing a composition rate of $In_2O_3$, $SnO_2$ and ZnO in ITZO, it is possible to form amorphous by sputtering method using only Ar gas and also crystallize at a temperature higher than the post baking temperature but lower than the heatresistant temperature of a semiconductor device.

Hereinafter, an example of an embodiment incorporating the semiconductor device of the present invention to an active matrix type TFT array substrate used for a liquid crystal display is described in detail. However, the present invention is not limited to the following embodiments. Further, for the clarity of explanation, the following description and drawings are omitted or simplified as appropriate.

First Embodiment

Figure 1:
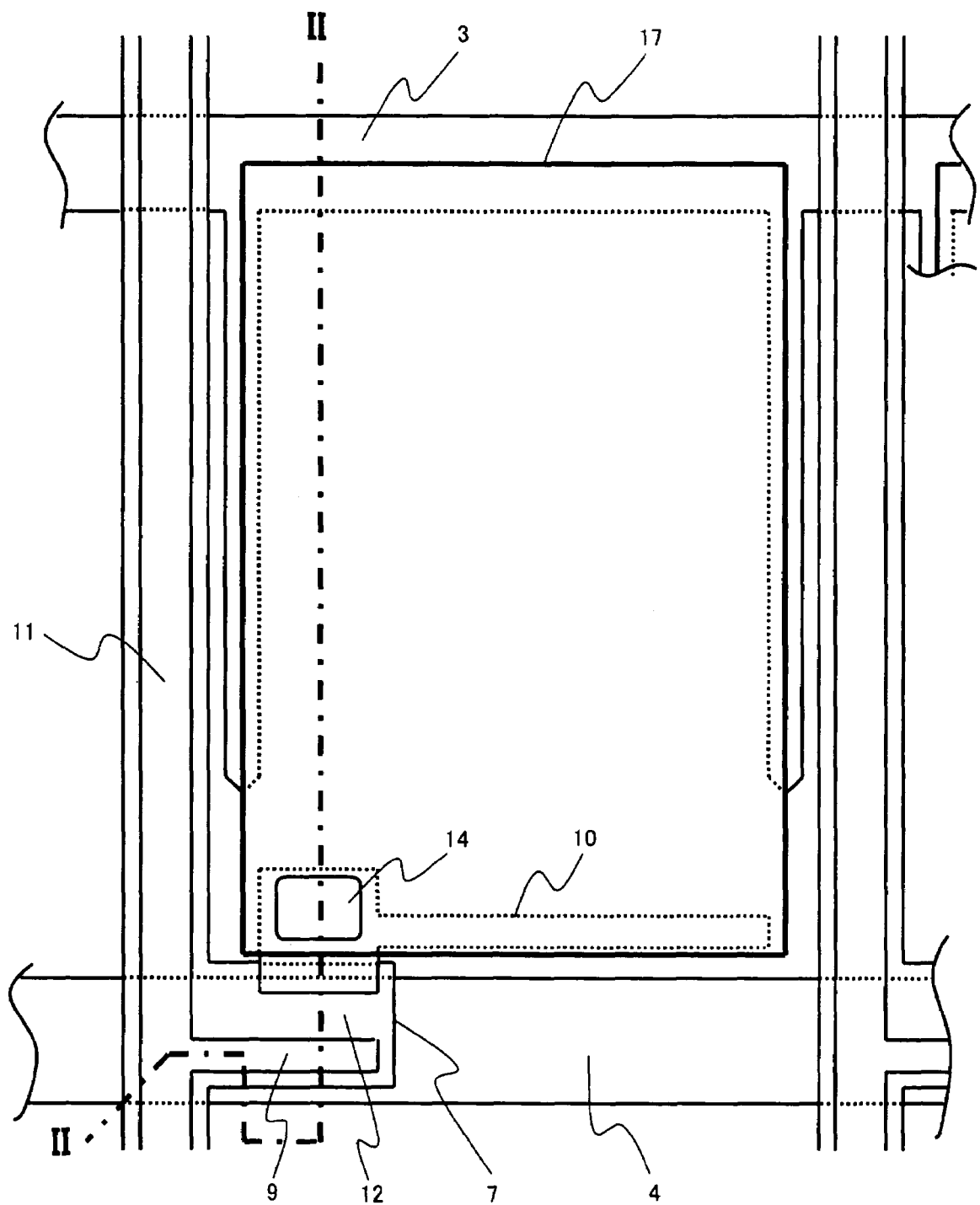
FIG. 1 is a plan view of an active matrix type TFT array substrate according to a first embodiment of the present invention.
Figure 2:
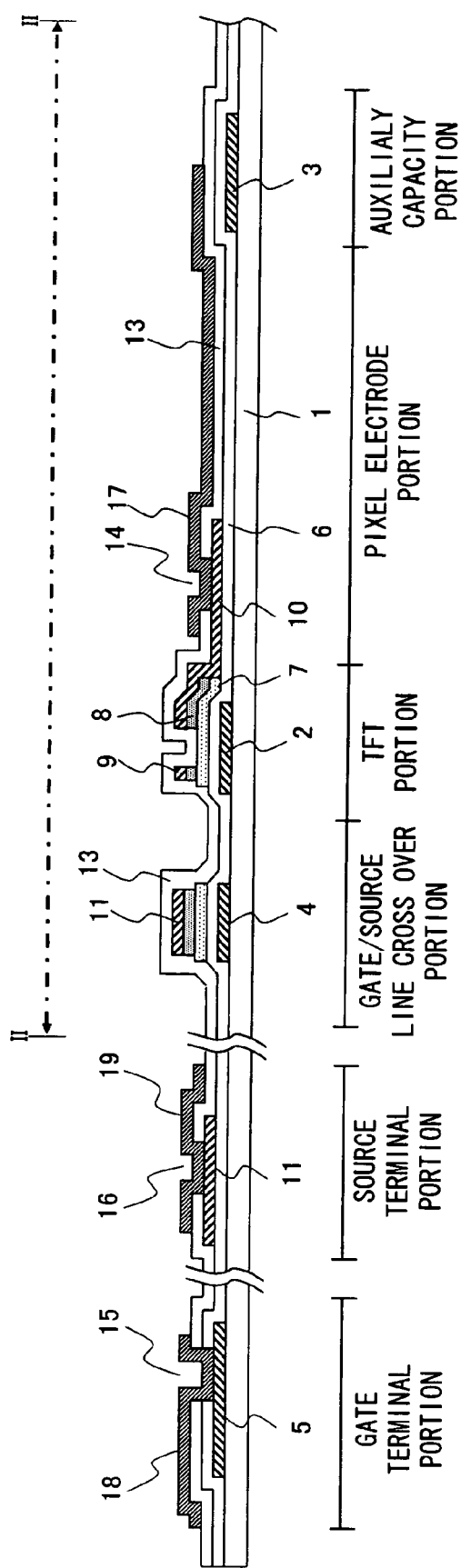
FIG. 2 is a cross-sectional diagram of the active matrix type TFT array substrate according to the first embodiment of the present invention.

FIG. 1 is a plan view showing a pixel of an image display region in a TFT active matrix substrate of a first embodiment. FIG. 2 is a cross-sectional diagram taken along the line II-II of FIG. 1 and also a cross-sectional diagram of a signal input terminal portion (not shown in FIG. 1) formed outside the image display region of the TFT active matrix substrate. As the signal input terminal portion, a gate terminal that a scan signal is input therein and a source terminal that a video signal is input therein are shown.

The TFT active matrix substrate shown in FIGS. 1 and 2 includes a transparent insulating substrate 1, a gate electrode 2, an auxiliary capacity common electrode 3, a gate line 4, a gate terminal 5, a gate insulating film 6, a semiconductor active film 7, an ohmic contact film 8, a source electrode 9, a drain electrode 10, a source line 11, a TFT channel portion 12, an interlayer dielectric film 13, a pixel drain contact hole 14, a gate terminal contact hole 15, a source terminal contact hole 16, a pixel electrode 17, a gate terminal pad 18 and a source terminal pad 19.

For the transparent insulating substrate 1, a transparent insulating substrate such as a glass substrate and fused quartz maybe used. The thickness of the insulating substrate 1 may be any thickness but preferably less than or equal to 1.1 mm so that the thickness of the liquid crystal display becomes thinner. If the insulating substrate 1 is too thin, the substrate is distorted due to various films forming and a thermal history of processes thereby decreasing patterning accuracy. Thus the thickness of the insulating substrate 1 needs to be selected in consideration over the process to be used. Further, if the insulating substrate 1 is made from brittle fracture material such as a glass, edge face of the substrate is preferably chamfered in light of preventing any foreign matters from getting inside. Further, it is preferable that a notch is created at a part of the transparent insulating substrate 1 so as to identify the orientation of the substrate for easier process management.

The gate electrode 2, auxiliary capacity electrode 3, gate line 4, and gate terminal 5 are formed over the transparent insulating substrate 1. The gate electrode 2, auxiliary capacity electrode 3, gate line 4 and gate terminal 5 are made from the same metal film. As for the metal film, Al alloy having a thickness of approx. 100 to 500 nm may be used.

The gate insulating film 6 is formed over the transparent insulating substrate 1, gate electrode 2, auxiliary capacity electrode 3, gate line 4 and gate terminal 5. As for the gate insulating film 6, a silicon nitride film ($SiN_x$), a silicon, oxide film ($SiO_x$), a silicon nitric-oxide film ($SiO_xN_y$) and a laminated film having a thickness of approx. 300 to 600 nm may be used. If the film is thin, it is likely to generate a short-circuit in a crossover of the gate and source lines so the film preferably has a thickness of more than the gate line 4 and auxiliary capacity electrode 3 or the like. On the other hand if the film thickness is thick, an ON current of TFT decreases and thus the display properties decrease.

The semiconductor active film 7 is formed over the gate insulating film 6. As for the semiconductor active film 7, an amorphous silicon (a-Si) film or a polycrystalline silicon (p-Si) film having a thickness of approx. 100 to 300 nm may be used. If the film is thin, the film is likely to disappear at a dry etching of the ohmic contact film 8, which is described later in detail. On the other hand, if the film is thick, the ON current of TFT decreases.

If a-Si film is used for the semiconductor active film 7, an interface to the a-Si film of the gate insulating film 6 is preferably $SiN_x$ or $SiO_xN_y$ in light of controllability and reliability of a threshold voltage ($V_{th}$) of the TFT, which is a gate voltage to make the TFT conductive. On the other hand if p-Si film is used for the semiconductor active film 7, an interface to the p-Si film of the gate insulating film 6 is preferably $SiO_x$ or $SiO_5N_y$ in light of controllability and reliability of $V_{th}$ of the TFT.

The ohmic contact film 8 is formed over the semiconductor active film 7. As for the ohmic contact film 8, an n type a-Si film or an n type p-Si film can be used, which is a-Si or p-Si having a thickness of approx. 20 to 70 nm doped with a small amount of P.

The source electrode 9 and drain electrode 10 are formed over the ohmic contact film 8 and are connected to the semiconductor active film 7 through the ohmic contact film 8. Further, the source electrode 9 extends to a source terminal (not shown) through the source line 11. The source electrode 9, drain electrode 10 and source line 11 are made from the same metal film. As for the metal film, Al alloy having a thickness of approx. 100 to 500 nm may be used.

The interlayer dielectric 13 is formed over the source electrode 9, drain electrode 10 and source line 11. As for the interlayer dielectric film 13, the same material as the gate insulating film 6 may be used.

The pixel electrode 17, gate terminal pad 18 and source terminal pad 19 are formed over the interlayer dielectric film 13. The pixel electrode 17, gate terminal pad 18 and source terminal pad 19 are made from the same transparent conductive thin film. The pixel electrode 17 is electrically connected to the drain electrode 10 via the pixel drain contact hole 14. The gate terminal pad 18 is electrically connected to the gate terminal 5 through the gate terminal contact hole 15. The source terminal pad 19 is electrically connected to the source terminal 11 through the source terminal contact hole 16. As for the transparent conductive thin film, ITZO which is a mixture of $In_2O_3$, $SnO_2$ and ZnO may preferably be used from the reason described later.

A manufacturing method of the TFT active matrix substrate of the first embodiment is described hereinafter in detail. Note that the example described hereinafter is a typical example and it is needless to say that another manufacturing method can be employed without departing from the scope and spirit of the invention.

Over the insulating substrate 1 with its surface cleansed, a first Al alloy film for forming the gate electrode 2, auxiliary capacity electrode 3, gate line 4 and gate terminal 5 etc. is formed by sputtering and vacuum evaporation methods.

Secondly the Al alloy film is patterned by a first photolithography process to form the gate electrode 2, auxiliary capacity electrode 3, gate line 4, and gate terminal 5 etc. The photolithography process is described as follows. After the TFT active matrix substrate is cleansed, photoresist is coated and dried. Then the substrate is exposed through a mask pattern with a specified pattern formed thereon and developed so as to form a resist transcribed with the mask pattern over the TFT active matrix substrate as in photoengraving. Further, after hardening the photoresist by heat treatment, the photoresist is etched. If the wettability between the photoresist and TFT active matrix substrate is not favorable, UV cleansing or steam coating is performed with HMDS (hexamethyldisilazane) or the like before coating the photoresist.

Further, if the adherence between the photoresist and TFT active matrix substrate is not favorable and that causes to separate them, the heat hardening temperature or the time for heat hardening is increased as appropriate. The etching of the Al alloy film can be a wet etching using an etchant. Further, the etching of the Al alloy film is preferably performed so that a pattern edge to be in a taper shape in light of preventing a short-circuit in bumps with other lines. Here, the taper shape refers that the pattern edge is etched so that the cross section becomes trapezoid. In the same process, it has been explained that the gate electrode 2, gate line 4, auxiliary capacity electrode 3 and gate terminal portion 5 are formed. However, it is not limited to this and various marks and lines needed to manufacture the TFT active matrix substrate may be formed.

Next, a thin film for forming the gate insulating film 6 made from $SiN_x$, $SiO_x$, $SiO_xN_y$ or the like, the semiconductor active film 7 made from a-Si or p-Si and the ohmic film 8 made from n type a-Si or n type p-Si are formed continuously by the plasma CVD method. When using the a-Si film as the semiconductor active film 7, by having a small film forming rate around the interface of the gate insulating film 6 and large film forming rate of the upper layer portion, it is possible to obtain a TFT with a large mobility and a small leak current at OFF time in a short film forming time. The patterns of the $SiN_x$, $SiO_xN_y$, a-Si, p-Si, n type a-Si and n type p-Si films can be formed by a dry etching using a known gas ($SiH_4$, $NH_3$, $H_2$, $NO_2$, $PH_3$, $N_2$ or mixed gas of the aforementioned gas).

Next, the semiconductor active film 7 and ohmic contact film 8 are patterned at least in a portion where the TFT portion is formed by a second photolithography process. The gate insulating film 6 remains all over. It is preferable that the semiconductor active film 7 and ohmic contact film 8 are patterned and remained in a portion where the source line, gate line 4 and auxiliary capacity electrode 3 cross over in a plan view, in addition to the portion where the TFT portion is formed, in light of having an increased withstand voltage in the crossover. Further, it is preferable to remain the semiconductor active film 7 and ohmic contact film 8 of the TFT portion to a lower portion of the source line in a continuous shape because the source electrode will not override the bumps of the semiconductor active film 7 and ohmic contact film 8, so that a disconnection of the source electrode is hard to be generated in the bumps. The etching of the semiconductor active film 7 and ohmic contact film 8 maybe dry etching by known gas composition (for example mixed gas of $SF_6$ and $O_2$ or mixed gas of $CF_4$ and $O_2$).

Next, an Al alloy film for forming the source electrode 9 and drain electrode 10 is formed by method such as sputtering. From the Al alloy film, the source line 11 (see FIG. 1), a source terminal (not shown), source electrode 9 and drain electrode 10 are formed by a third photolithography process.

Then, the ohmic contact film 8 is etched. A central part of the ohmic contact film 8 in the TFT portion is removed by this process to expose the semiconductor active film 7. The etching of the ohmic contact film 8 can be a dry etching by known gas composition (for example mix gas of $SF_6$ and $O_2$ or mixed gas of $CF_4$ and $O_2$).

Next, a film for forming the interlayer dielectric film 13 that is made from $SiN_x$, $SiO_x$, $SiO_xN_y$ or the like is formed by the plasma CVD method. The interlayer dielectric film 13 is formed from the film by a forth photolithography process. Using a light shielding mask (not shown) with an opening in a portion corresponding to the pixel drain contact hole 14, gate terminal contact hole 15, and source terminal contact hole 16 so as to expose evenly. After the expose process, it is developed using developer. Then, a region corresponding to the contact holes will have an opening by an etching process so as to expose the drain electrode 10 or the like.

Then, a transparent conductive thin film for forming the pixel electrode 17, gate terminal pad 18 and source terminal pad 19 or the like is formed by sputtering, vacuum evaporation and coating methods. To reduce the contact resistance with the Al alloy film, the sputtering method is preferred. The pixel electrode 17, gate terminal pad 18 and source terminal pad 19 or the like are made from the transparent conductive thin film by a fifth photolithography process.

The TFT active matrix substrate manufactured in this way is bonded with an opposing substrate (not shown) having a color filter and an opposing electrode with a spacer interposed therebetween, and liquid crystal is filled in the space. A liquid crystal display is made by mounting a liquid crystal panel holding this liquid crystal layer to a backlight portion.

Figure 3:
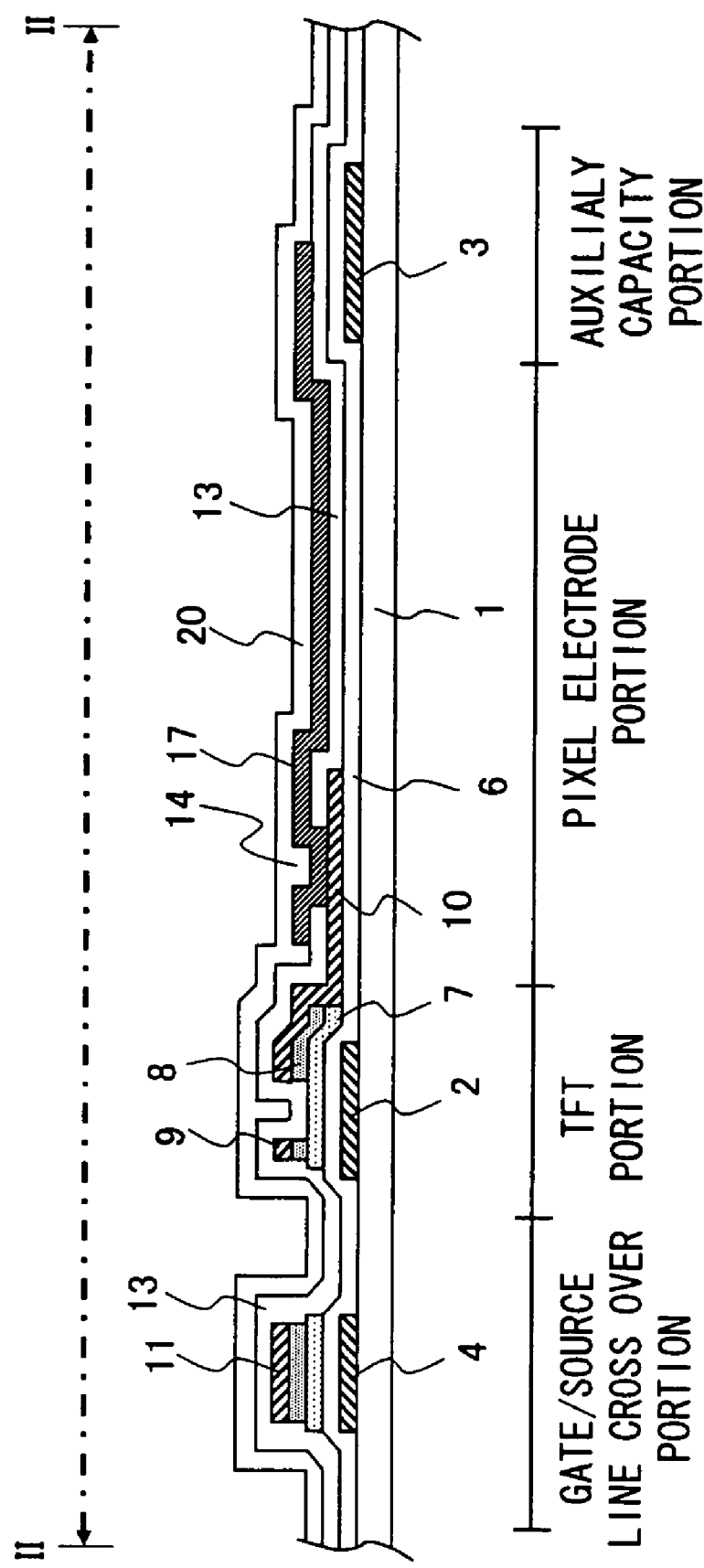
FIG. 3 is a cross-sectional diagram of the active matrix type TFT array substrate according to the first embodiment of the present invention.

If conductive foreign matter such as metal is mixed between the pair of substrates, the pixel electrode 17 and opposing electrode are electrically short-circuited via the conductive foreign matter and this could generate a defect (point defect) in pixel display of a corresponding pixel electrode. In order to prevent this and improve yield as shown in FIG. 3, a protective insulating film 20 may be formed to cover at least the pixel electrode 17. As a preferred embodiment of the protective insulating film 20, there are $SiO_x$ and $SiN_x$ film by a plasma CVD method.

If the $SiO_x$ and $SiN_x$ film is formed over a conventional ITO film by the plasma CVD method, the film abnormally grows in etching residue remaining in the pattern of the pixel electrode 17 and surface undulation becomes larger. By the undulation, there are problems that displays are clouded and that results in defects. This can be considered because that as monosilane ($SiH_4$) or ammonia ($NH_3$) is used as reactant gas of CVD method, ITO in the etching residue is exposed to plasma of reducing gas including hydrogen and this influences the growth of $SiN_x$ film. However, for the ITZO film of the first embodiment, as there is almost no etching residue generated, the above problem can be prevented. Note that as an upper layer of the protective insulating film 20, an insulating organic resin film may be formed by coating.

EXAMPLE 1

A specific example of the first embodiment is described hereinafter in detail. As for a first metal film (the gate electrode 2, auxiliary capacity electrode 3, gate line 4 and gate terminal 5) and a second metal film (the drain electrode 9 and source electrode 10) of the first embodiment, Al-3.0 mol % Mo alloy film, which is pure Al added with 5 mol % Mo is used. An ITZO film having a mass ratio of $In_2O_3$:$SnO_2$:ZnO=89:7:4 is used as a transparent conductive film (the pixel electrode 17, gate terminal pad 18 and source terminal pad 19). A molar ratio of each element in the ITZO film is In=30.8 mol %, Sn=3.6 mol %, Zn=6.0 mol % and O=59.6 mol %. Specifically, the molar ratio In/(In+Sn+Zn)=0.76, the molar ratio Sn/Zn=0.6. The molar ratio is calculated by measuring mass of each oxide at a composition before forming the film so as to obtain the mass ratio and a molar ratio is calculated from atomic weight of each element. Further, a molar ratio of metallic elements in the ITZO film is measured by ICP (Inductivity Coupled Plasma) Emission Spectrometry. And it has been discovered that the molar ratio calculated by the composition rate before forming the film and the molar ratio obtained from the measurement result by the ICP Emission Spectrometry are almost the same.

The ITZO film is formed by known sputtering method using only Ar gas. As a result of analyzing the formed ITZO film by X-ray diffraction analysis, there is no diffraction peak recognized and confirmed as amorphous. Next, a photoresist pattern is formed by photolithography process and etched with known oxalate solution. Then the photoresist pattern is removed to form the pixel electrode 17, gate terminal pad 18 and source terminal pad 19. Further, a heat treatment is performed of temperature 250 degree Celsius for approx. 30 minutes in an atmosphere. From an analysis of the ITZO film after the heat treatment by X-ray diffraction analysis, diffraction peak is recognized and crystallization is confirmed.

The ITZO film which is a transparent conductive film according to the first embodiment can be formed amorphous by sputtering method using only Ar gas, not mixing $H_2O$ or $H_2$ as opposed to an ITO film. Therefore dust is not generated in the sputtering and foreign matter mixed in the film can be reduced to $1/10$ or less. Further, as weak acid oxalate solution can be used for etchant, it is possible to prevent a Al alloy film which is lower layer first and second metal films from corroding and disconnection at an etching. Furthermore, as an ITZO film is not partially crystallized in a post baking process in a resist patterning of photolithography process, there is almost no etching residue generated. Moreover, after the patterning, by performing a heat treatment to crystallize in order to form a film having chemically stable and good acid resistance, the reliability is also improved.

A contact resistance value of the pixel electrode 17 and drain electrode 10 in the pixel drain contact hole 14, a contact resistance value of the gate terminal pad 18 and the gate terminal 5 in the gate terminal contact hole 15 and a contact resistance value of a connector between the source terminal pad 19 and the source terminal 11 in the source terminal contact hole 16 are approx. 1 kΩ for an area of contact hole opening 50 μm$^2$.

A contact resistance value of the conventional ITO and pure Al film is approx. 100 MΩ for an area of contact hole opening 50 μm$^2$. A contact resistance value of the ITZO film and Al-5 mol % Mo alloy film according to the first embodiment is $1/10^5$ of the conventional art and is extremely favorable value.

Next, an interface structure of the abovementioned Al—Mo and ITZO films is examined. Specifically, a depth profile is examined for using X-ray photoelectron spectroscopy. As for the X-ray photoelectron spectrometer, Quantum2000 manufactured by ULVAC-PHI, Inc. is used. Conditions of the analysis are that a source of radiation Al—K alpha ray, a beam diameter 100 μm, and an output 20 kV-100 W. Hereinafter, for the ease of explanation, a thin film including the upper layer ITZO film and the lower layer Al—Mo film is referred to as ITZO/Al—Mo.

Figure 4:
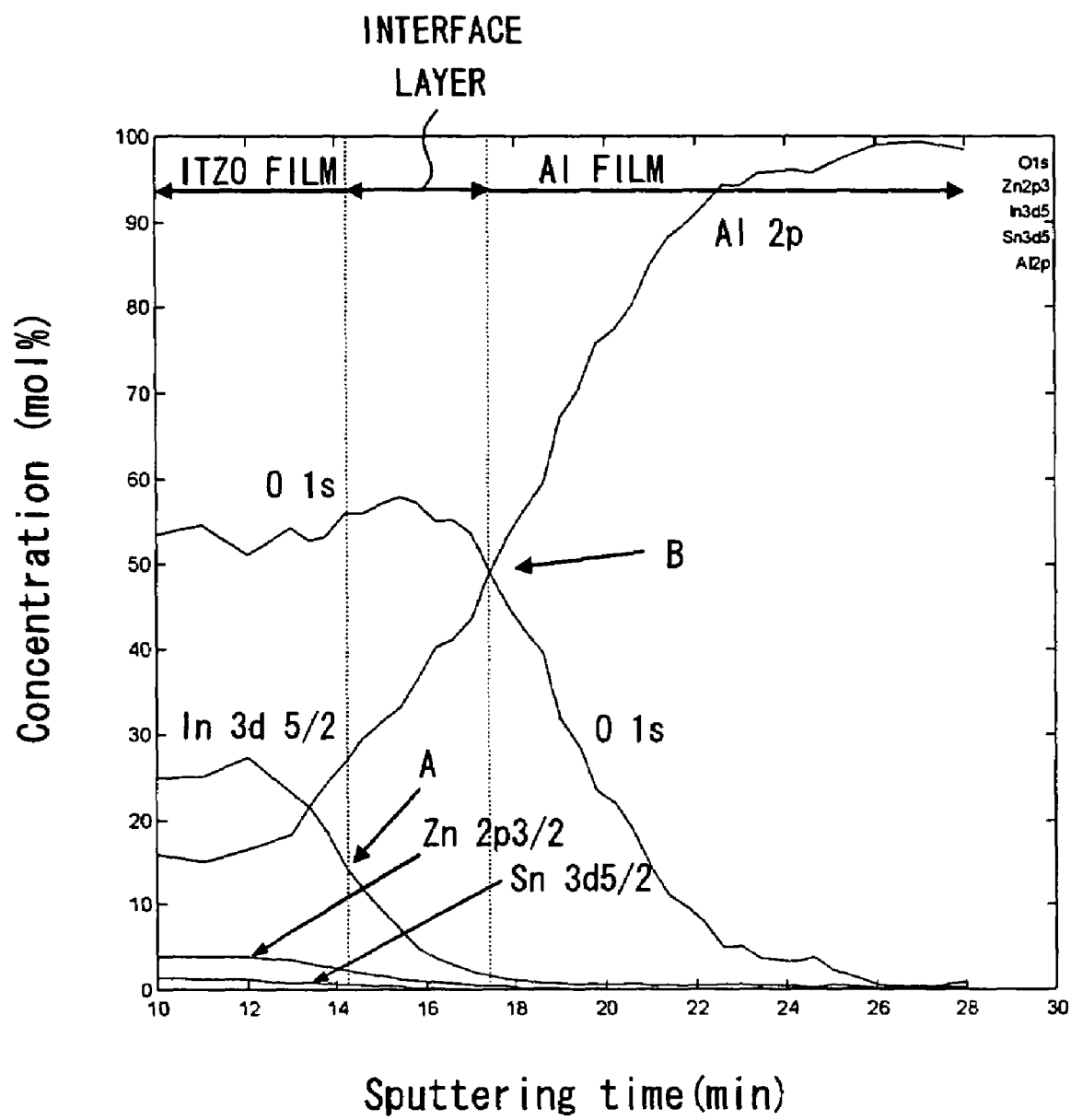
FIG. 4 shows a depth profile for an ITZO/Al—Mo alloy laminated film by X-ray photoelectron spectroscopy analysis according to the first embodiment of the present invention.

FIG. 4 is shows a depth profile for Al ($2p$ orbital component), O ($1s$ orbital component), In ($3d$ orbital component), Sn($3d$ orbital component) and Zn($2p$ orbital component) by an X-ray photoelectron spectroscopy in a near interface layer of the above assay sample ITZO/AL-Mo. Note that the analysis of Mo is not conducted here. The horizontal axis in FIG. 4 indicates sputtering time, and the vertical axis indicates mol % concentration of the above element. In the by an X-ray photoelectron spectroscopy of this embodiment, a sample is etched by sputtering and the depth profile is obtained by analyzing its surface. Accordingly the sputtering time indicated by the horizontal axis corresponds to the depth from the ITZO surface, which is the upper layer.

As shown in FIG. 4, in a region in which the sputtering time is short, there are many O, In, Zn and Sn which are constituent elements of the upper layer ITZO film, and the longer the sputtering time, the more Al exists which is constituent elements of the lower layer Al—Mo film.

A region between a depth that is a half of the maximum concentration of In(indicated by A in FIG. 4) and a depth that is a half of the maximum concentration of Al (indicated by B in FIG. 4) is defined as an interface layer. Further, a region upper layer than A in FIG. 4 is defined as an ITZO film. A region lower layer than B in FIG. 4 is defined as an Al—Mo film. Furthermore, a region to the side of the ITZO film is defined as a near ITO interface layer, while a region to the side of the Al—Mo film is defined as a near Al—Mo interface layer.

Referring to FIG. 4, it can be seen that 0 concentration is increasing in the interface layer. This indicates that $AlO_x$ exists in the interface layer. As $AlO_x$ is an insulator, if the $AlO_x$ exists all over the interface, the electric conductivity is supposed to be blocked. However, practically as set forth above, the contact resistance value of the connector or the like between the pixel electrode 17 and drain electrode 10 in the pixel drain contact hole 14 according to this embodiment is extremely low as compared to the conventional example.

Figure 5:
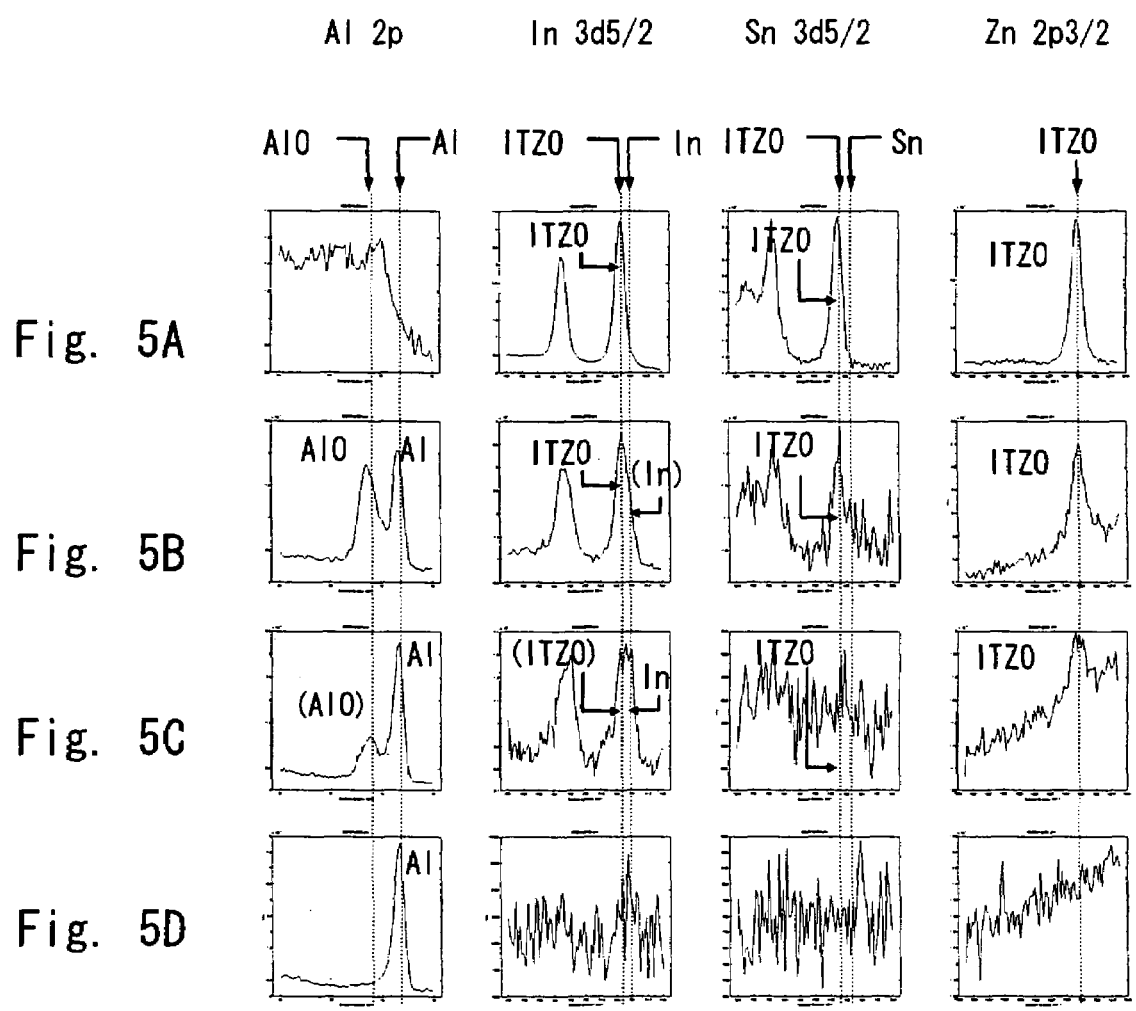
FIGS. 5A to 5D show an X-ray photoelectron spectrum of an interface of the ITZO/Al—Mo alloy laminated film according to the first embodiment of the present invention.

Therefore, connection condition of Al ($2p$ orbital component), Zn ($2p$ orbital component), In ($3d$ orbital component) and Sn ($3d$ orbital component) are examined in 4 points of a depth direction (the ITZO, near ITO interface layer, near Al—Mo interface layer and Al—Mo films) using an X-ray photoelectron spectrum. The results are shown in FIGS. 5A to 5D. FIG. 5A shows the ITZO film, FIG. 5B shows the near ITZO interface layer, FIG. 5C shows the near Al—Mo interface layer and FIG. 5D shows a connection condition of each of the above elements in the Al—Mo film.

In the ITZO film, only ITZO is detected (see FIG. 5A) In the near ITZO interface layer $AlO_x$, Al, ITZO and In are detected (see FIG. 5B). In the near Al—Mo interface layer, $AlO_x$, Al, ITZO and In are detected (see FIG. 5C). In the Al—Mo film, only Al was detected (see FIG. 5D). In FIGS. 5A to 5D, $AlO_x$ is referred to as AlO for convenience.

Figure 6:
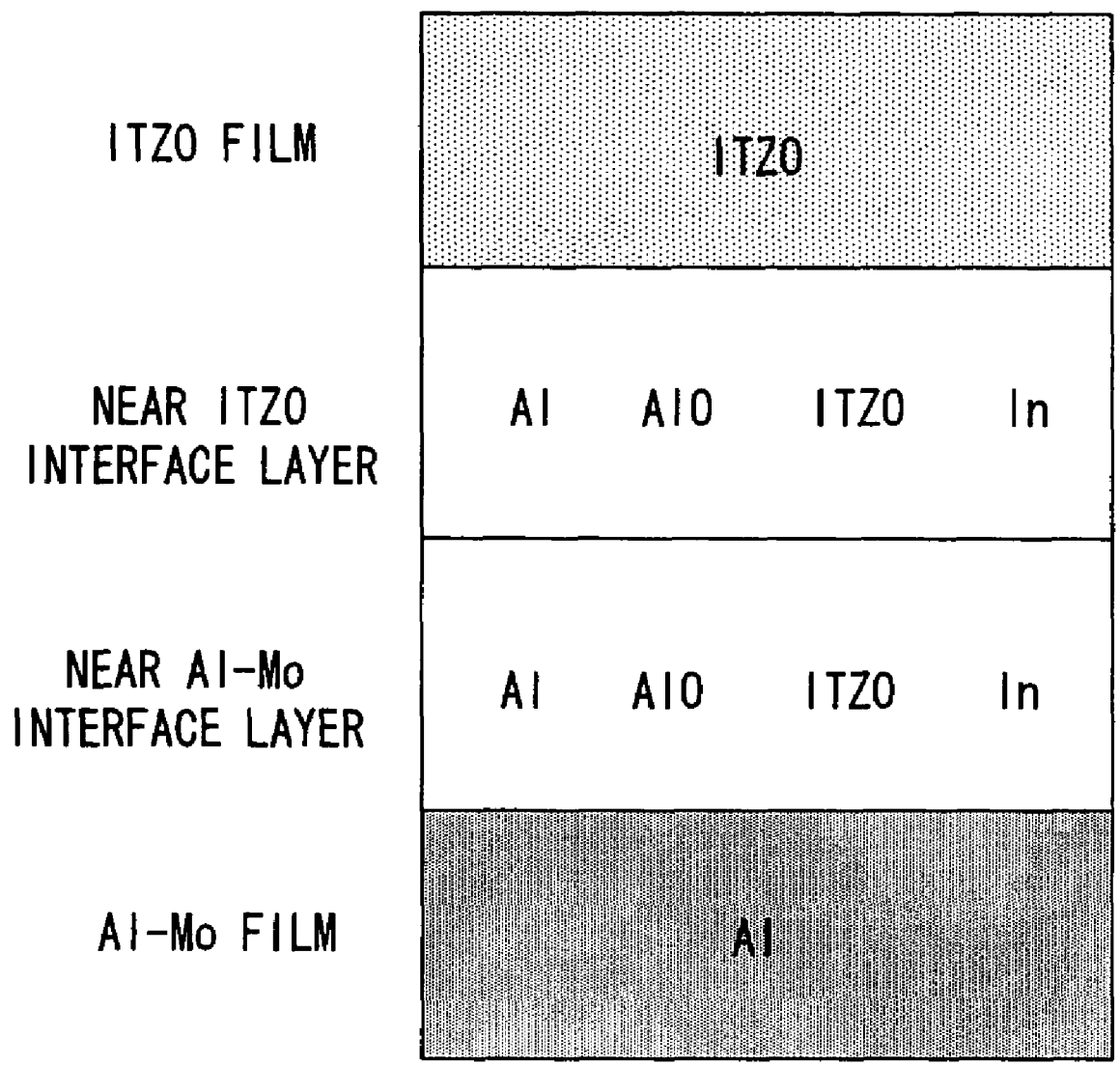
FIG. 6 schematically shows an interface structure of the ITZO/Al—Mo alloy laminated film according to the first embodiment.

FIG. 6 schematically shows the structure of ITZO film, near ITZO interface layer, near Al—Mo interface layer and Al—Mo films. As shown in FIG. 6, when the Al—Mo and ITZO films contact, Al, In and ITZO having conductivity exist in addition to the $AlO_x$, which is an insulator. Specifically, $AlO_x$ does not exist all over the interface, and in the portion where $AlO_x$ does not exist, a conductive path is formed between the ITZO and Al—Mo films by the above conductive material existing continuously in the depth direction of the interface layer, thus a favorable electric contact characteristic was obtained. Incidentally, by having Zn, $In_2O_3$ is reduced and $AlO_x$ was suppressed from forming.

Second Embodiment

A second embodiment of the present invention is described hereinafter with reference to FIG. 7. The second embodiment incorporates an embodiment of the present invention to an active matrix type TFT array substrate constituting an organic field effect light emitting display unit using organic EL light-emitting device. The organic field effect light emitting display unit includes an anode pixel electrode having top-emission type structure.

Figure 7:
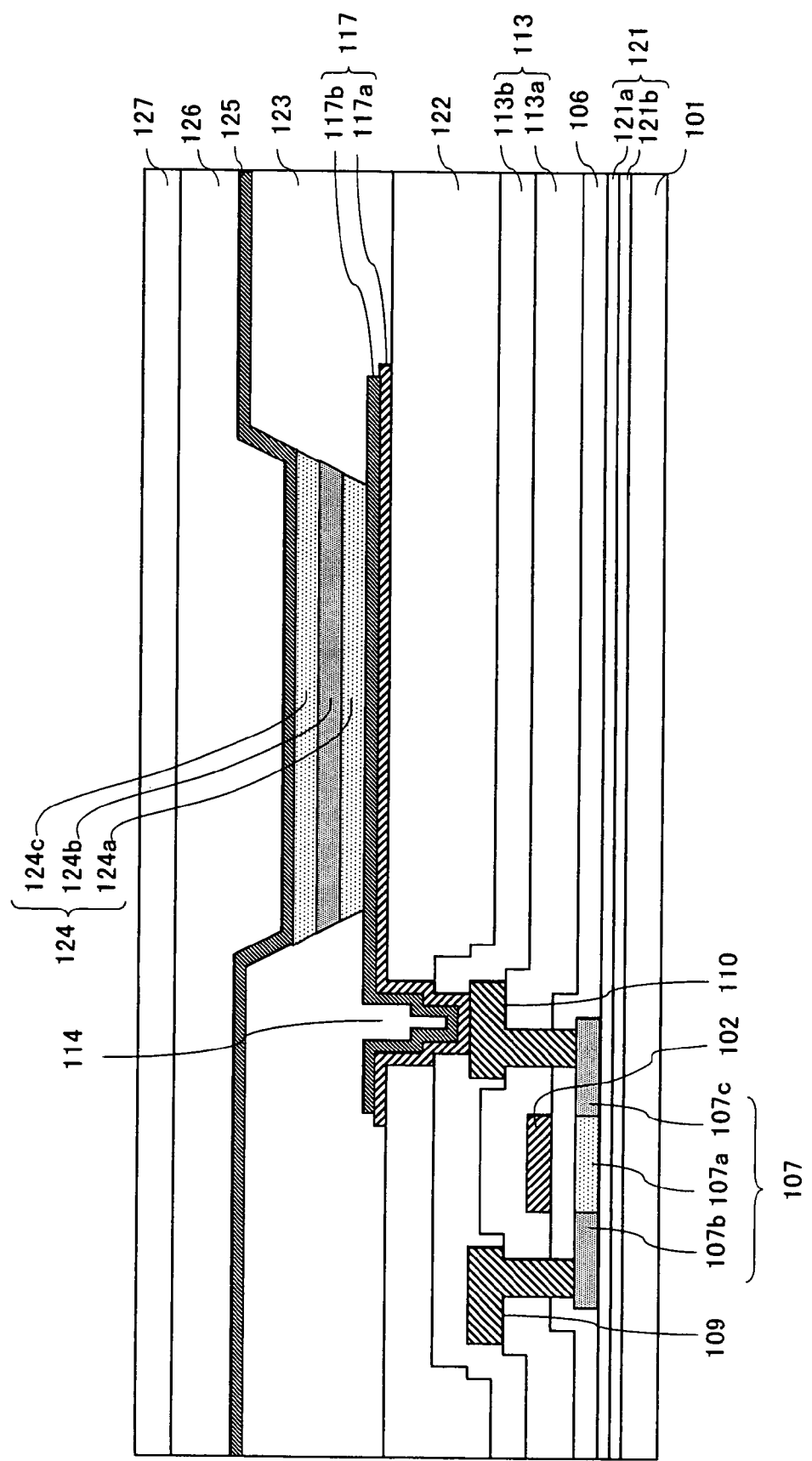
FIG. 7 is a cross-sectional diagram of an active matrix type TFT array substrate according to a second embodiment of the present invention.

FIG. 7 is a cross-sectional diagram of an active matrix type TFT array substrate constituting the organic field effect light emitting display unit and a pixel portion indicating the organic EL device formed on top. The active matrix type TFT array substrate of the second embodiment includes a transparent insulating substrate 101, a gate electrode 102, a gate insulating film 106, p-Si film 107, a source electrode 109, a drain electrode 110, an interlayer dielectric film 113, a pixel drain contact hole 114, an anode pixel electrode 117, a transparent insulating film 121, a planarizing film 122, a separation film 123, an electroluminescence layer 124, a cathode pixel electrode 125, a sealing layer 126 and an opposing substrate 127.

The transparent insulating substrate 101, gate electrode 102, gate insulating film 106, source electrode 109 and drain electrode 110 are same as the components of the first embodiment, and thus they will not be explained here.

The p-Si film 107 is formed on the transparent insulating film 121. The p-Si film 107 includes a channel region 107a, a source region 107b and a drain region 107c.

The interlayer dielectric film 113 is composed of a first interlayer dielectric film 113a and a second interlayer dielectric film 113b. The first interlayer dielectric film 113a is formed to cover the gate insulating film 106 and gate electrode 102 formed thereabove. The second interlayer dielectric film 113b is formed to cover the first interlayer dielectric film 113a and source electrode 109 and drain electrode 110 that are formed thereon. As for the interlayer dielectric film 113, the same sort of the material as the interlayer dielectric film 13 can be used. The source electrode 109 and drain electrode 110 are connected respectively to the source region 107b and drain region 107c through contact holes penetrating the interlayer dielectric film 113.

The anode pixel electrode 117 is composed of a first anode 117a and a second anode 117b. The first anode 117a is formed on the planarizing film 112 and the second anode 117b is formed on the first anode 117a. As for the first anode 117a of the second embodiment, Al alloy film is used. As for the second anode 117b, an ITZO film which is a transparent conductive film is used. The anode pixel electrode 117 is connected to the lower layer of drain electrode 110 through the pixel drain contact hole 114 that penetrates the planarizing film 122 and second interlayer dielectric film 113b.

The transparent insulating film 121 is composed of a first transparent insulating film 121a and a second transparent insulating film 121b. The first transparent insulating film 121a is formed above the transparent insulating substrate 101 and preferably made from $SiN_x$ film. The second transparent insulating film 121b is formed on the first transparent insulating film 121a and preferably made from $SiO_x$ film.

The planarizing film 122 is formed on the second interlayer dielectric film 113b. As the planarizing film 122 is required to be planarized, an insulating resin formed by coating method may be used.

The separation film 123 is formed over the planarizing film 122 and electrically separates adjacent pixels (not shown). Thus the separation film 123 is formed to be bank shape like a frame around the anode pixel electrode 117.

The electroluminescence layer 124 is formed on the second anode 117b that is surrounded by the separation film 123. The electroluminescence layer 124 is of organic EL material. The electroluminescence layer 124 basically includes three layers laminated in order of a hole transport layer 124a, an organic EL layer 124b and an electron transport layer 124c from the side of the anode pixel electrode 117. Incidentally, it may be a known structure adding at least one of a hole injection layer (not shown) held between the hole transport layer 124a and anode pixel electrode 117 or an electron injection layer (not shown) laminated directly on the electron transport layer 124c. That is, the electroluminescence layer 124 may be 4 or 5 layer structure.

The cathode pixel electrode 125 is formed to cover the electroluminescence layer 124 and separation film 123. The cathode pixel electrode 125 is a transparent conductive film made from ITO, IZO, ITZO or the like. Further, the cathode pixel electrode 125 is an opposing electrode for passing current to the electroluminescence layer 124 by a potential difference with the anode pixel electrode 117.

The sealing layer 126 is formed to the cathode pixel electrode 125. The sealing layer 126 is a layer for blocking the electroluminescence layer 124 from moisture and impurity. The opposing substrate 127 is formed on the sealing layer 126 to be an opposite side of the insulating substrate 101

In the organic field effect light emitting display unit shown in FIG. 7, a signal voltage transmitted from the source electrode 109 is applied to the anode pixel electrode 117 via the drain electrode 110, a current flows in the electroluminescence layer 124 by a voltage difference with the cathode pixel electrode 125 so that the organic EL layer 124b emits light. The light emitted in the organic EL layer 124b is reflected at the anode pixel electrode 117 having light reflectivity, transmits the cathode pixel electrode 125, radiated to an upper portion of the substrate and becomes visible.

Thus the anode pixel electrode 117 is required to have a high work function and light reflectivity for increasing charge injecting rate to the organic EL layer 124. For example, a known Cr (approx. 4.5 eV) film and Mo (approx. 4.6 eV) films have high work function but low light reflectivity. As a result of examination, the light reflectivity for wavelength 550 nm is that for Cr, it is 67& and for Mo, it is 60%. On the other hand, for example, a known Al film has a high light reflectivity of more than 90% but work function is lower than the preferable value of 4.0 eV. Therefore, there is a known art about an anode having laminated structure in which a transparent conductive film such as ITO and IZO with high work function (approx. 4.7 eV or more) and also high light transmission is formed as an upper layer of an Al having high light reflectivity. However, as described above, the combination of Al and ITO films have been unable to be practical use because an insulating layer $AlO_x$ is formed in the interface and electric continuity is blocked.

EXAMPLE 2

A specific example of the second embodiment is described hereinafter in detail. In example 2 to overcome the above problem, for the first anode 117a, Al-5 mol % Mo alloy film that is pure Al added with 5 mol % Mo is used, and for the second anode 117b, ITZO film having a mass ratio of $In_2O_3$: $SnO_2$:ZnO=89:7:4 is used. A molar ratio of each element in the ITZO film is In=30.8 mol %, Sn=3.6 mol %, Zn=6.0 mol % and O=59.6 mol %. Specifically, the molar ratio In/(In+Sn+Zn)=0.76, the molar ratio Sn/Zn=0.6.

The anode pixel electrode 117 can be formed by the following process. Firstly an Al—Mo alloy film to be the first anode 117a is formed to have a thickness of approx. 50 nm. Secondly an amorphous ITZO film to be the second anode 117b is formed to have a thickness of approx. 20 nm. Then a photoresist pattern is formed by photolithography method, and the Al—Mo alloy and ITZO films are etched in a batch in a known chemical including phosphoric acid+nitric acid+acetic acid. After that, the photoresist pattern is removed to form the anode pixel electrode 117. Lastly perform a heat treatment of temperature 250 degree Celsius for approx. 30 minutes to crystallize the ITZO film which is the second anode 116b.

The amorphous ITZO film having a composition used in the example 2 can be etched by chemical of phosphoric acid+nitric acid+acetic acid, which is known Al enchant. Thus when laminating with an Al film, it is preferable that the amorphous ITZO film can be etched in a batch at the same time with the Al film. Further, as there is no crystallized region in the ITZO film, there is almost no etching residual. Furthermore by crystallizing the ITZO film, corrosion resistance to the chemical for the ITZO film can be improved. Therefore chemicals used for cleansing the substrate and for forming the electroluminescence layer 124 and pixel electrode 125, which are post-processes, cannot permeate into the ITZO film and corrode it.

A contact resistance value between the Al—Mo alloy film which is the first anode 117a constituting the anode pixel electrode 117 and the ITZO film which is the second anode 117b is approx. 1 kΩ for an area of contact hole opening 50 $\mu m^2$. This is approx. $1/10^5$ of a contact resistance value between conventional Al and ITO films and is extremely favorable value.

According to an embodiment of the present invention, it is possible to achieve the anode pixel electrode 117 having both high light reflectivity by an Al alloy film and high work function by an ITZO film. Accordingly an organic field effect light emitting display unit having high luminous efficiency and bright display images is obtained.

From an analysis of the interface between the Al—Mo alloy film which is the first anode 117a and the ITZO film which is the second anode 117b according to the second embodiment by X-ray photoelectron spectrometer, similar interface structure as the example 1 is formed.

In the second embodiment, the thickness of the Al—Mo alloy film is 50 nm in the example 2 but may be any from 10 to 200 nm. Having a thickness under 10 nm, light transparent component increases to be so to say translucent, thus the reflectivity decreases. On the other hand, having a thickness over 200 nm, crystal grains become coarse and the surface undulation of the anode pixel electrode 117 becomes larger. To be more specific, if an average roughness Ra of the anode pixel electrode 177 exceeds 1.0 nm, coating defects of the electroluminescence layer 124 that is formed over the anode pixel electrode 117 are likely to generate and that causes short-mode failure etc. with the cathode pixel electrode 125.

Although the thickness of the ITZO film is explained as 20 nm but may be any as long as it is 3.5 nm or more. Having a film thickness of 3.5 nm or more, an even film grown to be layered can be formed. Specifically, it is possible to prevent defective display caused by defective film.

Third Embodiment

A third embodiment of the present invention is described hereinafter in detail. In the second embodiment, an ITO, IZO and ITZO films or the like are used for the cathode pixel electrode 125 of the organic field effect light emitting display unit shown in FIG. 7. The cathode pixel electrode 125 is formed all over the display region as an opposing electrode that is common to the anode pixel electrode 117 for each pixel and a common cathode potential is supplied through an external input terminal formed to extend. Accordingly, the larger the display screen, the lower the resistance of the cathode pixel electrode 125.

Figure 8:
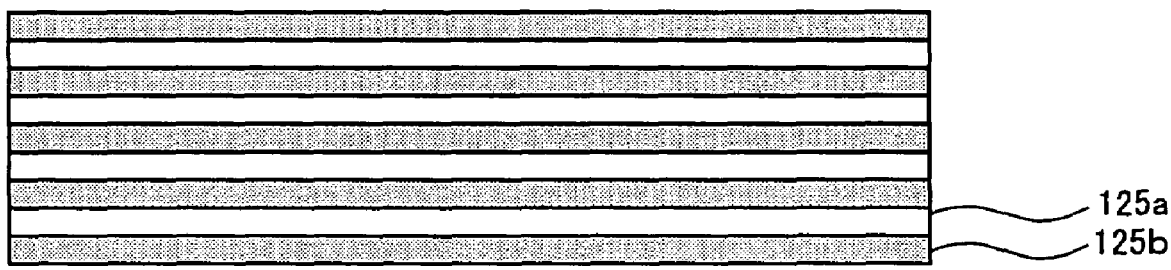
FIG. 8 is a cross-sectional diagram of a cathode pixel electrode according to a third embodiment of the present invention.

Thus in the third embodiment, as for the cathode pixel electrode 125, a multilayer film laminating an Al alloy film which is a first cathode 125a and an ITZO film which is a second cathode 125b for several times as shown in FIG. 8 is used. Components other than the cathode pixel electrode 125 are same as the configuration of the second embodiment shown in FIG. 7.

As for the first cathode 125a, Al-5 mol % Mo alloy film, which is pure Al added with 5 mol % Mo is used. As for the second cathode 125b, an ITZO film having a mass ratio of $In_2O_3:SnO_2:ZnO=89:7:4$ is used. A molar ratio of each element in the ITZO film is In=30.8 mol %, Sn=3.6 mol %, Zn=6.0 mol % and O=59.6 mol %. Specifically, the molar ratio In/(In+Sn+Zn)=0.76, the molar ratio Sn/Zn=0.6.

The cathode pixel electrode 125 can be formed in the following process, for example. Firstly an amorphous ITZO film to be the second cathode 125b is formed to have a thickness of approx. 5 nm by known sputtering method using Ar gas. Then an Al—Mo alloy film is continuously formed to have a thickness of approx. 5 nm by the same sputtering method. After repeating the film-forming step for 4 times, the ITZO 119b is formed to the top layer so as to form a multilayer film having a thickness of approx. 85 nm in total of 9 layers. Further, a photoresist pattern is formed by photolithography method, and the multilayer of the Al—Mo alloy and ITZO films are etched in a batch at the same time in a known chemical including phosphoric acid+nitric acid+acetic acid. After that, the photoresist pattern is removed to form the cathode pixel electrode 125.

The amorphous ITZO film having a composition used in the third embodiment can be etched by chemical of phosphoric acid+nitric acid+acetic acid, which is known Al enchant. Thus when laminating with an Al film, it is preferable that the amorphous ITZO film can be etched in a batch at the same time with the Al film. Further, as there is no crystallized region in the film, there is almost no etching residual. Furthermore by crystallizing the ITZO film, corrosion resistance to the chemical for the ITZO film can be improved. Therefore chemicals used for cleansing the substrate and for forming the electroluminescence layer 124 and pixel electrode 125, which are post-processes, cannot permeate into the ITZO film and corrode it.

Light transmittance of the cathode pixel electrode 125 that is constituted of the multilayer film formed as above is approx. 85% for wavelength 550 nm which is same as the value for ITZO film, a single layer film. Further, a specific resistance value in a direction parallel to the film face was reduced to approx. 2 µΩm which is less than half of approx. 5 µΩm for the ITZO film, a single layer film. On the other hand, a resistance value of the contact portion in the contact interface between the Al—Mo alloy film and ITZO film for the multilayer film structure is confirmed to be favorable display properties, although not measured directly. Thus it is assumed that the resistance value to be almost same as the first and second embodiments.

Thus the structure of laminated layer connection interface of Al—Mo alloy film/ITZO film/Al—Mo alloy film is examined in detail. Hereinafter for ease of convenience, Al—Mo alloy film/ITZO film/Al—Mo alloy film are referred to as Al—Mo/ITZO/Al—Mo.

Figure 9:
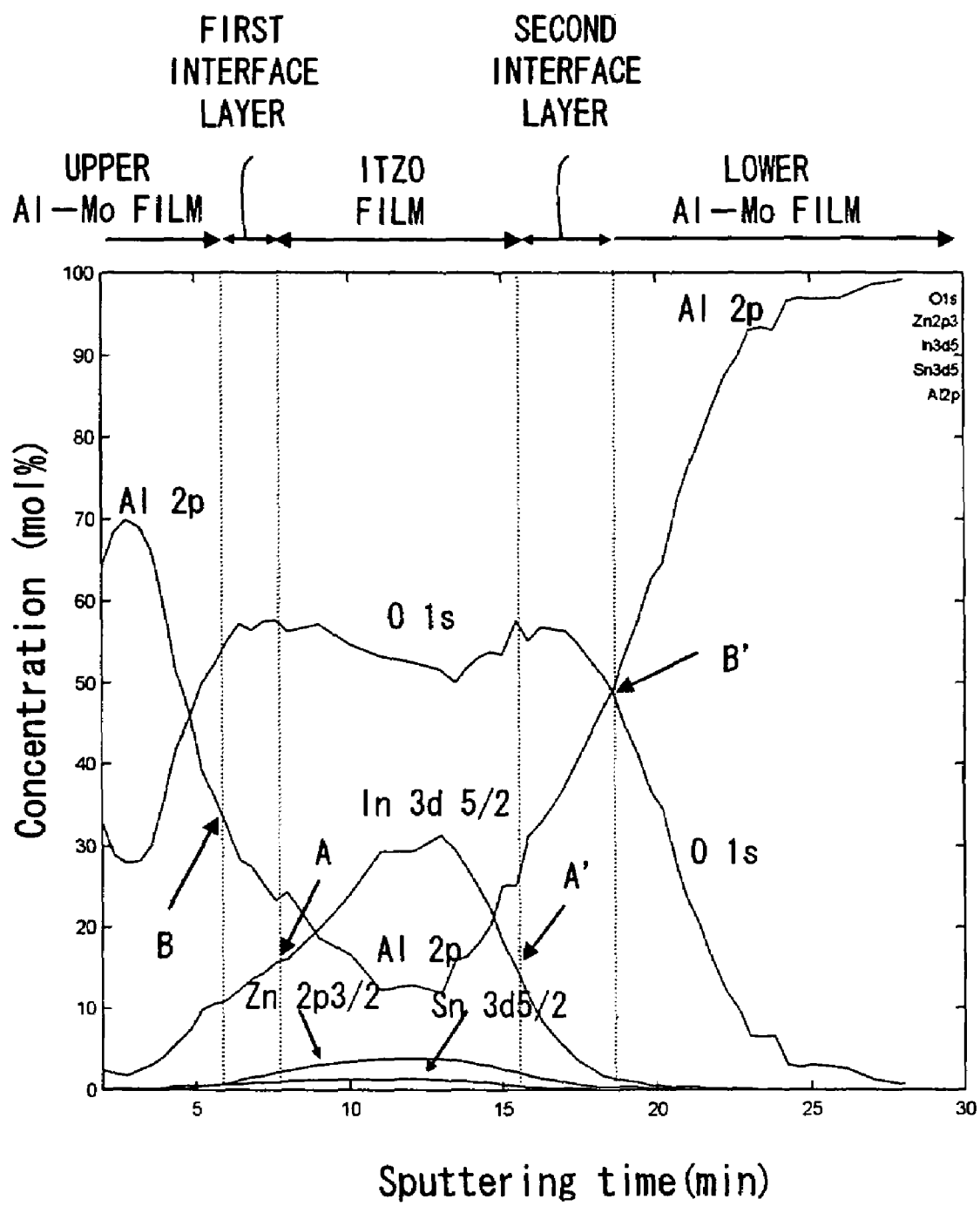
FIG. 9 shows a depth profile for an Al—Mo/ITZO/Al—Mo laminated film by X-ray photoelectron spectroscopy analysis according to the third embodiment of the present invention.

FIG. 9 shows a depth profile for Al($2p$ orbital component), O($1s$ orbital component), In ($3d$ orbital component), Zn ($2p$ orbital component) and Sn ($3d$ orbital component) by X-ray photoelectron spectroscopy analysis near the surface of the Al—Mo/ITZO/Al—Mo. Conditions for analysis are the same as the example 1.

As shown in FIG. 9, in a region in which the sputtering time is short, there are many Al which is a constituent element of the upper layer Al—Mo film, and the longer the sputtering time, the more O, In, Zn and Sn exist which is constituent elements of the intermediate layer ITZO film, and further longer the sputtering time, the more Al exist which is a constituent element of the lower layer Al—Mo film.

As shown in FIG. 9, in the interface between the upper layer Al—Mo and ITZO film, a region between a depth that is a half of the maximum concentration of In(indicated by A in FIG. 9) and a depth that is a half of the maximum concentration of Al (indicated by B in FIG. 9) is defined as a first interface layer. Likewise, in the interface between the ITZO and lower layer Al—Mo, a region between a depth that is a half of the maximum concentration of In(indicated by A' in FIG. 9) and a depth that is a half of the maximum concentration of Al (indicated by B' in FIG. 9) is defined as a second interface layer. Further, a region upper layer than B and a region lower than B' in FIG. 9 is respectively defined as an upper Al—Mo film and a lower Al—Mo film. Furthermore, a region between A and A' is defined as an ITZO film. Moreover, a region in the first and second interface layers to the side of the ITZO film is respectively defined as a first near ITZO interface layer and a second near ITZO layer, while a region in the first and second interface layers to the side of the Al—Mo film is respectively defined as a near Al—Mo upper interface layer and a near Al—Mo lower interface layer.

Referring to FIG. 9, it can be seen that O concentration is increasing in the two interface layers. This indicates that $AlO_x$ exists in the interface layer. As $AlO_x$ is an insulator, if the $AlO_x$ exists all over the interface, the electric conductivity is supposed to be blocked. However, practically as set forth above, the contact resistance value was favorable.

Figure 10:
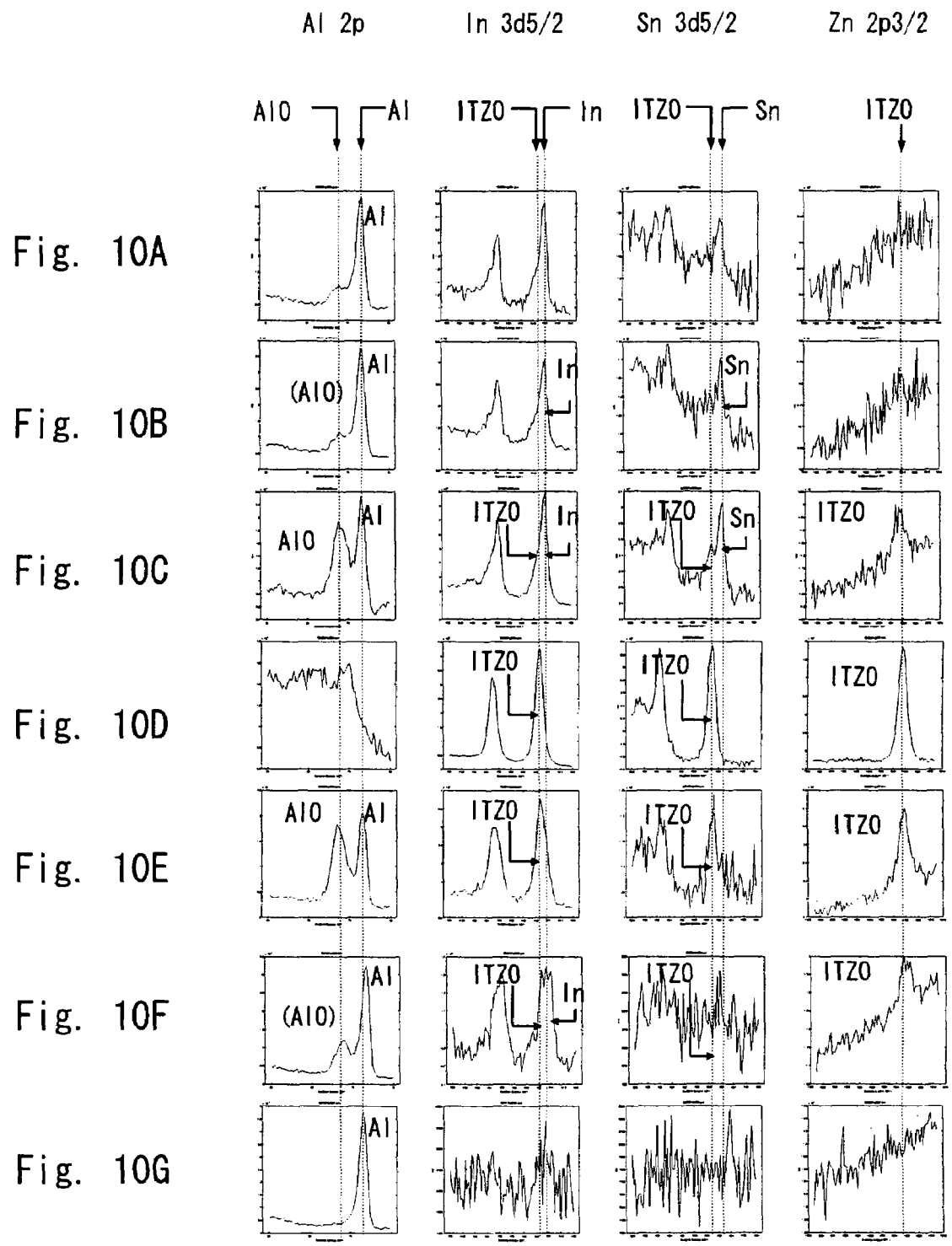
FIGS. 10A to 10G show an X-ray photoelectron spectrum of an interface of the Al—Mo/ITZO/Al—Mo laminated film according to the third embodiment of the present invention.

Therefore, connection condition of Al ($2p$ orbital component), In ($3d$ orbital component), Sn ($3d$ orbital component) and Zn ($2p$ orbital component) are examined in 7 points of a depth direction (the upper Al—Mo film, near Al—Mo upper interface layer, first near ITZO interface layer, ITZO film, second near ITZO interface layer, near Al—Mo lower interface layer and lower Al—Mo film) using an X-ray photoelectron spectrum. The results are shown in FIGS. 10A to 10G. FIG. 10A shows the upper Al—Mo film, FIG. 1B shows the near Al—Mo upper interface layer, FIG. 10C shows the first near ITZO interface layer, FIG. 10D shows the ITZO film, FIG. 10E shows the second near ITZO interface layer, FIG. 10F shows the near Al—Mo lower interface layer, FIG. 10G shows connection condition of each of the above elements in the lower Al—Mo film.

In the upper Al—Mo film, $AlO_x$, Al, In and Sn were detected (see FIG. 10A). In the near Al—Mo upper interface layer, $AlO_x$, Al, In and Sn were detected (see FIG. 10B). In the first near ITZO interface layer, $AlO_x$, Al, In, Sn and ITZO were detected (see FIG. 10C). In the ITZO film, only ITZO was detected (see FIG. 10D). In the second near ITZO interface layer, $AlO_x$, Al and ITZO were detected (see FIG. 10E). In the near Al—Mo lower interface layer, $AlO_x$, Al, In and ITZO were detected (see FIG. 10F). In the lower Al—Mo film only Al as detected (see FIG. 10G). Note that in FIGS. 10A to 10G, $AlO_x$ is referred to as AlO for convenience.

Figure 11:
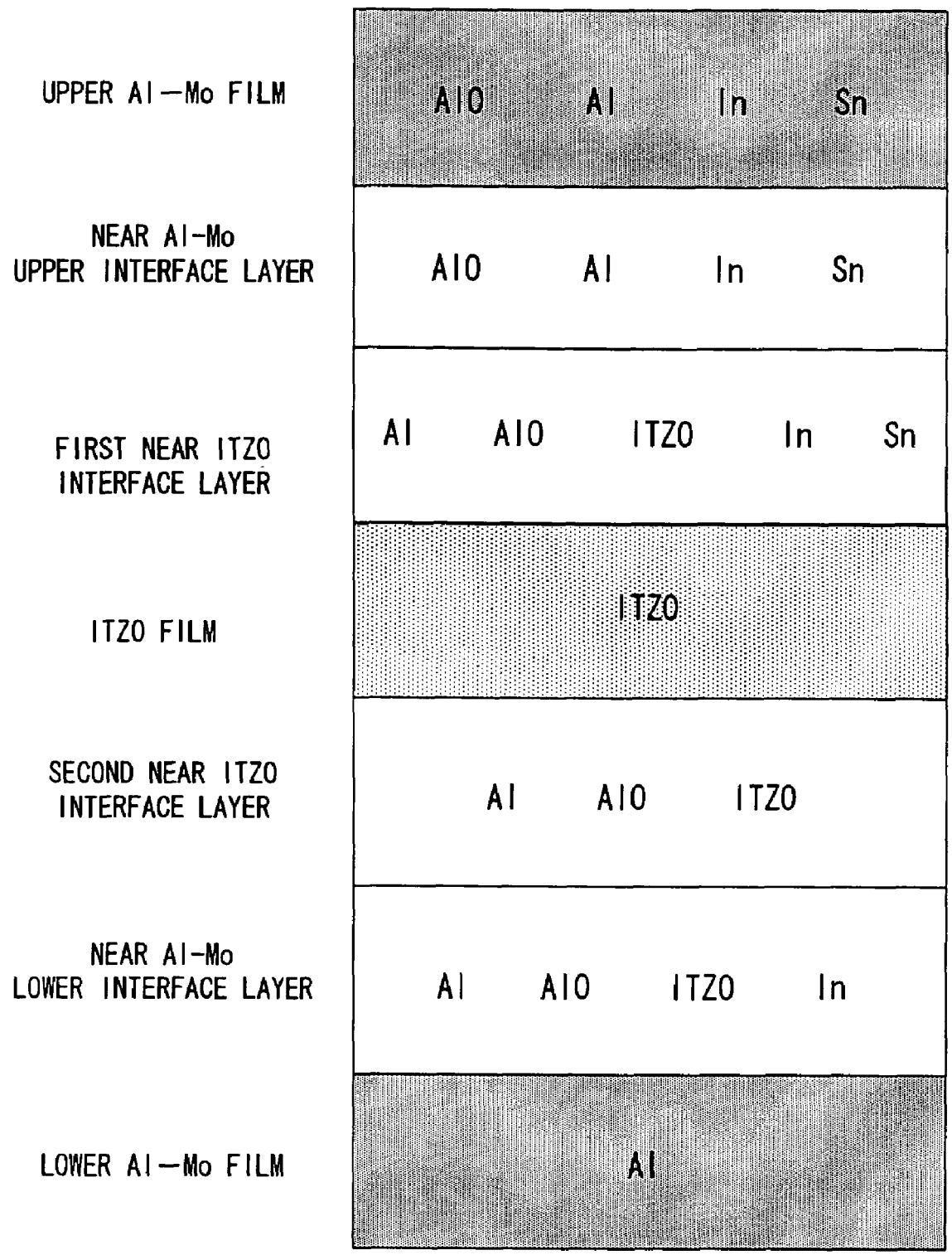
FIG. 11 schematically shows an interface structure of the Al—Mo/ITZO/Al—Mo laminated film according to the third embodiment.

FIG. 11 schematically shows the structures of the upper Al—Mo film, near Al—Mo upper interface layer, first near ITZO interface layer, ITZO film, second near ITZO interface layer, near Al—Mo lower interface layer and lower Al—Mo film from the result of FIGS. 10A to 10G. As shown in FIG. 11, when the Al—Mo and ITZO films contact, Al, In, Sn and ITZO having conductivity exist in addition to the $AlO_x$, which is an insulator. Specifically, $AlO_x$ does not exist all over the interface, and in the portion where $AlO_x$ does not exist, a conductive path is formed between the ITZO and Al—Mo films by the above conductive material existing continuously in the depth direction of the interface layer, thus a favorable electric contact characteristic was obtained. Incidentally, by having Zn, $In_2O_3$ and $SnO_2$ are reduced and $AlO_x$ was suppressed from forming.

The cathode pixel electrode 125 of the third embodiment is 9 layer multilayer film laminating the Al—Mo film which is the first cathode 125*a* and ITZO film which is the second cathode 125*b* alternately but it is not limited to this and may be 2 layers or more. The order of laminating the films may be inversed. However, to improve the efficiency of charge injection and charge transport, the ITZO film preferably contacts the electroluminescence layer 124. Further, the thickness of the ITZO and Al—Mo alloy films are 5 nm each but not limited to this and may be set to any thickness according to required specific resistance value and light transmittance of the cathode pixel electrode 125. However, to secure high light transmittance, the thickness of the Al—Mo alloy film preferably should not exceed 10 nm.

As set forth above, according to the third embodiment, the cathode pixel electrode 125 having both low resistance and high light transmittance can be achieved. By the lower resistance, a cathode potential that is even to the entire screen can be supplied even if the display screen size increases. Therefore, an organic field effect light emitting display unit can be achieved with a high luminous efficiency and bright display images without non-uniformity of brightness.

In the first to third embodiments, an Al—Mo film is used which is an Al alloy film added with Mo as an alloying element. By adding Mo to Al, even if an Al and ITZO films are electrically connected, a phenomena can be prevented in which Al and ITZO corrode by an electrochemical reaction (cell reaction) in organic alkali developer for developing photoresist in photolithography process. Further, surface undulation called hillock due to stress at a heat treatment can be prevented. Preventing from generating surface undulation is especially effective in incorporating to an anode pixel electrode requiring a high evenness. Further, it can be considered that Mo precipitates in the interface portion with the ITZO film and has an effect of reducing a contact resistance in the interface portion. A composition rate of Mo added to Al is preferably from 2 to 10 mol %. If it is under 2 mol %, the advantageous effect of preventing a cell reaction with the ITZO film in organic alkali etchant is not sufficient. On the other hand, if it exceeds 10 mol %, low resistance and high reflectivity for Al alloy film are lost.

An alloying element adding to Al is not limited to Mo but the above advantageous effect can be achieved by W, for example. Further, one or more kinds of alloying elements selected from Fe, Co and Ni can be added. In such case, in addition to the advantageous effect of suppressing cell reaction, a contact resistance in the interface portion with the ITZO film can further be reduced.

Furthermore, in addition to the one or more kinds of alloying elements selected from Mo, W, Fe, Co and Ni, one or more kinds of elements selected from rare-earth metal including Y, La, Ce, Nd, Sm, Gd, Tb and Dy may be added. In such case, the advantageous effect of suppressing hillock can be improved. Moreover, one or more kinds of alloying elements selected from N, C and Si may be added. In such case, as $AlO_x$ in the interface with the ITZO film can be suppressed from forming, a contact resistance can further be reduced. However, to achieve low resistance and high reflectivity for Al, the amount of addition for the alloying elements is preferably 10 mol % or less in total.

Fourth Embodiment

A fourth embodiment is that a Mo film or Mo alloy film is used for the first metal film and/or second metal film in the example 1 of the first embodiment. In such case also, it can be made the same way as with Al and Al alloy film, achieving similar advantageous effects.

The fourth embodiment is described hereinafter with reference to FIG. 1. As for the first metal film (gate electrode 2, auxiliary capacity electrode 3, gate line 4 and gate terminal 5) and for the second metal film (drain electrode 9 and source electrode 10), pure Mo film is used. An ITZO film having a mass ratio of $In_2O_3$:$SnO_2$:ZnO=89:7:4 is used as a transparent conductive film (the pixel electrode 17, gate terminal pad 18 and source terminal pad 19). A molar ratio of each element in the ITZO film is In=30.8 mol %, Sn=3.6 mol %, Zn=6.0 mol % and O=59.6 mol %. Specifically, the molar ratio In/(In+Sn+Zn)=0.76, the molar ratio Sn/Zn=0.6.

The ITZO film is formed by known sputtering method using only Ar gas. As a result of analyzing the formed ITZO film by X-ray diffraction analysis, there is no diffraction peak recognized and confirmed as amorphous. Next, a photoresist pattern is formed by photolithography process and etched with known oxalate solution. Then the photoresist pattern is removed to form the pixel electrode 17, gate terminal pad 18 and source terminal pad 19. Further, a heat treatment is performed of temperature 250 degree Celsius for approx. 30 minutes in an atmosphere. From an analysis of the ITZO film after the heat treatment by X-ray diffraction analysis, diffraction peak is recognized and crystallization is confirmed.

The ITZO film which is a transparent conductive film according to a fourth embodiment can be formed amorphous by sputtering method using only Ar gas, not mixing $H_2O$ or $H_2$. Therefore dust is not generated in the sputtering and foreign matter mixed in the film can be reduced to $\frac{1}{10}$ or less. Further, as weak acid oxalate solution can be used for etchant, it is possible to prevent a pure Mo film which is lower layer first and second metal films from corroding and disconnection at an etching. Furthermore, as an ITZO film is not partially crystallized in a post baking process in a resist patterning of photolithography process, there is almost no etching residue generated. Moreover, after the patterning, by performing a heat treatment to crystallize the ITZO film in order to form a film having chemically stable and good acid resistance, the reliability is also improved.

A contact resistance value of the pixel electrode 17 and drain electrode 10 in the pixel drain contact hole 14, a contact resistance value of the gate terminal pad 18 and the gate terminal 5 in the gate terminal contact hole 15 and a contact resistance value of a connector between the source terminal pad 19 and the source terminal 11 in the source terminal contact hole 16 are approx. $10\Omega$ for an area of contact hole opening 50 $\mu m^2$.

A contact resistance value of the conventional ITO and pure Al film is approx. 100 M$\Omega$ for an area of contact hole opening 50 $m^2$. A contact resistance value of the ITZO film and pure Mo film according to the fourth embodiment is $\frac{1}{10}^7$ of the conventional art and is extremely favorable value.

Fifth Embodiment

A fifth embodiment is that a Mo film or Mo alloy film is used for the first cathode 125*a* of the third embodiment (see FIG. 8). In such case also, it can be made the same way as with Al and Al alloy film, achieving similar advantageous effects.

Thus in the fifth embodiment, as for the cathode pixel electrode 125, a multilayer film laminating an Mo alloy film which is a first cathode 125*a* and an ITZO film which is a second cathode 125*b* for several times as shown in FIG. 8 is used. Components other than the cathode pixel electrode 125 are the same as the configuration of the second embodiment shown in FIG. 7.

As for the first cathode 125*a*, Mo-5 mol % Nb alloy film, which is pure Mo added with 5 mol % Mo is used. As for the second cathode 125*b*, an ITZO film having a mass ratio of $In_2O_3:SnO_2:ZnO=89:7:4$ is used. A molar ratio of each element in the ITZO film is In=30.8 mol %, Sn=3.6 mol %, Zn=6.0 mol % and O=59.6 mol %. Specifically, the molar ratio In/(In+Sn+Zn)=0.76, the molar ratio Sn/Zn=0.6.

The cathode pixel electrode 125 can be formed in the following process, for example. Firstly an amorphous ITZO film to be the second cathode 125*b* is formed to have a thickness of approx. 5 nm by known sputtering method using Ar gas. Then a Mo—Nb alloy film is continuously formed to have a thickness of approx. 5 nm by the same sputtering method. After repeating the film-forming step for 4 times, the ITZO 119*b* is formed to the top layer so as to form a multi-layer film having a thickness of approx. 85 nm in total of 9 layers. Further, a photoresist pattern is formed by photolithography method, and the multilayer of the Mo—Nb alloy and ITZO films are etched in a batch at the same time in a known chemical including phosphoric acid+nitric acid+acetic acid. After that, the photoresist pattern is removed to form the cathode pixel electrode 125.

The amorphous ITZO film having a composition used in the fifth embodiment can be etched by chemical of phosphoric acid+nitric acid+acetic acid, which is known Mo enchant. Thus when laminating with a Mo film, it is preferable that the amorphous ITZO film can be etched in a batch at the same time with the Mo film. Further, as there is no crystallized region in the film, there is almost no etching residual. Furthermore by crystallizing the ITZO film, corrosion resistance to the chemical for the ITZO film can be improved. Therefore chemicals used for cleansing the substrate or the like, which is a post-process, cannot permeate into the ITZO film and corrode it.

Light transmittance of the cathode pixel electrode 125 that is constituted of the multilayer film formed as above is approx. 85% for wavelength 550 nm which is the same as the value for ITZO film, a single layer film. Further, a specific resistance value in a direction parallel to the film face was reduced to approx 2 μΩm which is less than half of approx. 5 μΩm for the ITZO film, a single layer film. On the other hand, a resistance value of the contact portion in the contact interface between the Mo—Nb alloy film and ITZO film for the multilayer film structure is confirmed to be favorable display properties, although not measured directly. Thus it is assumed that the resistance value to be almost the same as the fourth embodiment.

Thus the structure of laminated layer connection interface of Mo—Nb alloy film/ITZO film/Mo—Nb alloy film is examined in detail. Hereinafter for ease of convenience, Mo—Nb alloy film/ITZO film/Mo—Nb alloy film are referred to as Mo—Nb/ITZO/Mo—Nb.

Figure 12:
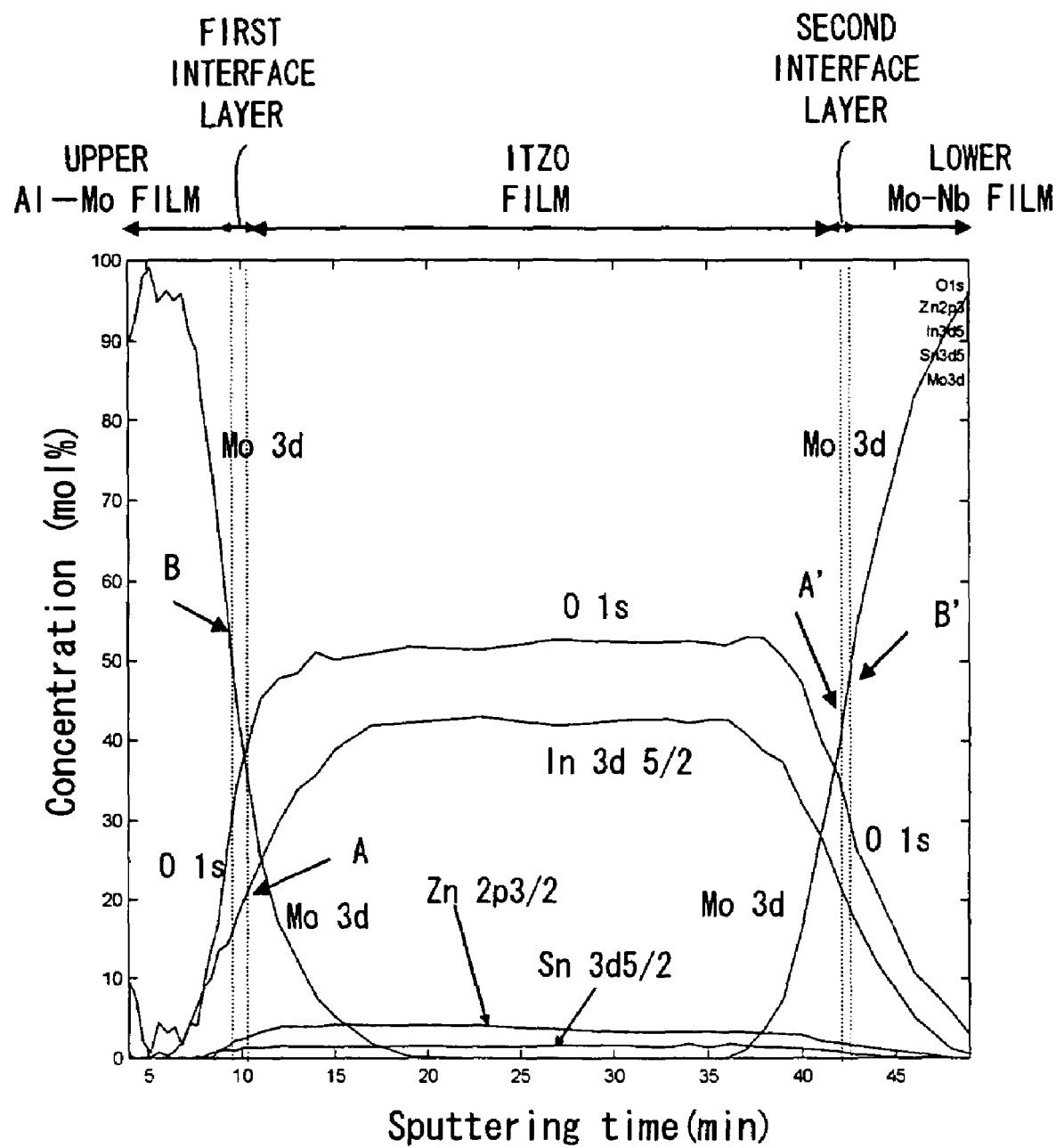
FIG. 12 shows a depth profile for a Mo—Nb/ITZO/Mo—Nb laminated film by X-ray photoelectron spectroscopy analysis according to a fifth embodiment of the present invention.

FIG. 12 shows a depth profile for Mo(3*d* orbital component), O(1*s* orbital component), In (3*d* orbital component), Zn (2*p* orbital component) and Sn (3*d* orbital component) by X-ray photoelectron spectroscopy analysis near the surface of the Mo—Nb/ITZO/Mo—Nb. Conditions for analysis are same as the example 1.

As shown in FIG. 12, in a region in which the sputtering time is short, there are many Mo which is a constituent element of the upper layer Mo—Nb film, and the longer the sputtering time, the more O, In, Zn and Sn exist which is constituent elements of the intermediate layer ITZO film, and further longer the sputtering time, the more Mo exist which is a constituent element of the lower layer Mo—Nb film.

As shown in FIG. 12, in the interface between the upper layer Mo—Nb and ITZO film, a region between a depth that is a half of the maximum concentration of In(indicated by A in FIG. 12) and a depth that is a half of the maximum concentration of Mo (indicated by B in FIG. 12) is defined as a first interface layer. Likewise, in the interface between the ITZO and lower layer Mo—Nb, a region between a depth that is a half of the maximum concentration of In(indicated by A' in FIG. 12) and a depth that is a half of the maximum concentration of Mo (indicated by B' in FIG. 12) is defined as a second interface layer. Further, a region upper layer than B and a region lower than B' in FIG. 12 is respectively defined as an upper Mo—Nb film and a lower Mo—Nb film. Furthermore, a region between A and A' is defined as an ITZO film. Moreover, a region in the first and second interface layers to the side of the ITZO film is respectively defined as a first near ITZO interface layer and a second near ITZO layer, while a region in the first and second interface layers to the side of the Mo—Nb film is respectively defined as a near Mo—Nb upper interface layer and a near Mo—Nb lower interface layer.

Referring to FIG. 12, as Mo and O coexist, Mo oxide ($MoO_x$) is able to exist in the two interface layers. As $MoO_x$ is an insulator, if the $MoO_x$ exists all over the interface, the electric conductivity is supposed to be blocked. However, practically as set forth above, the contact resistance value was favorable.

Figure 13:
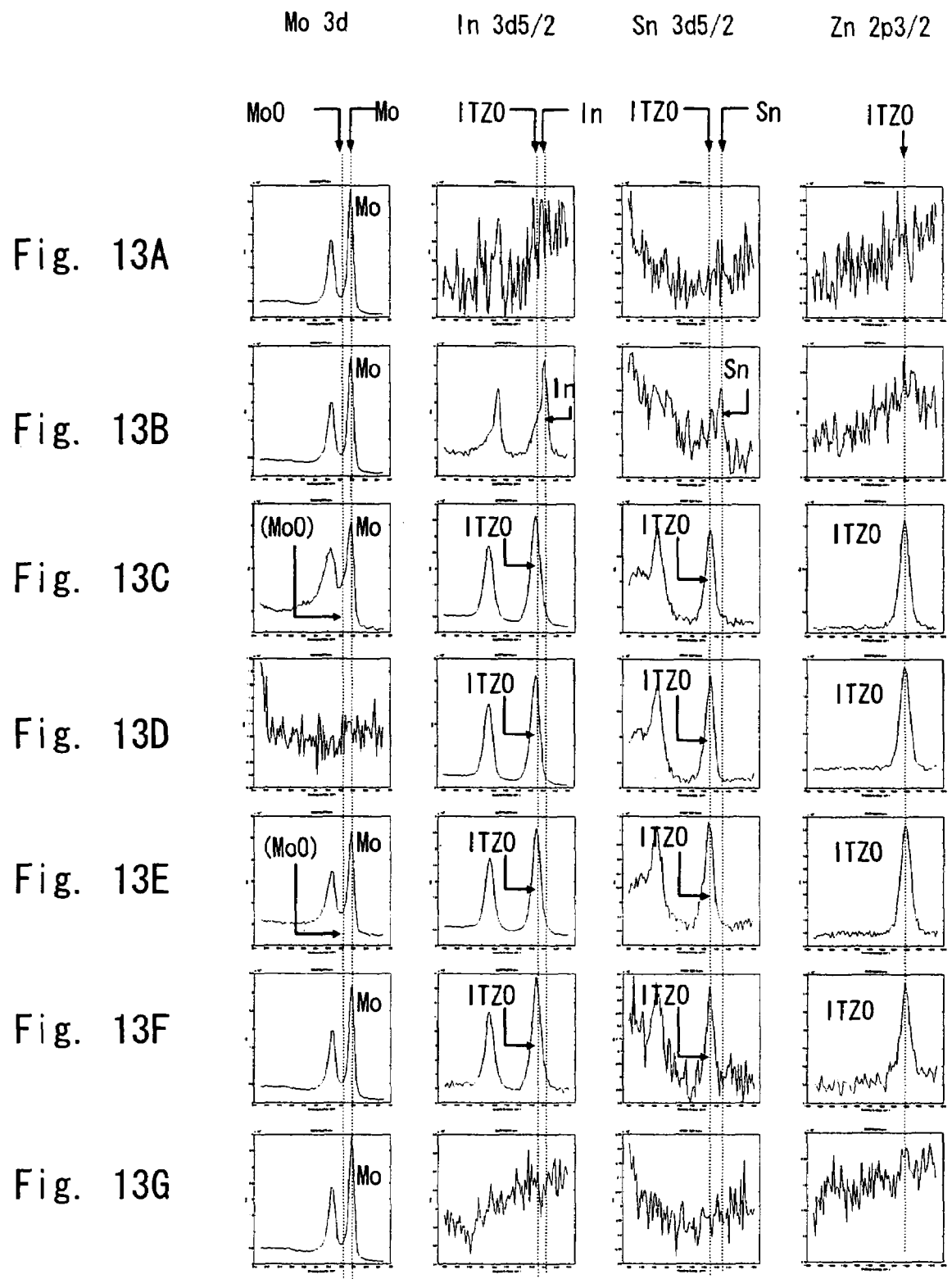
FIGS. 13A to 13G show an X-ray photoelectron spectrum of an interface of the Mo—Nb/ITZO/Mo—Nb laminated film according to the fifth embodiment of the present invention.

Therefore, connection condition of Mo (3*d* orbital component), In (3*d* orbital component), Sn (3*d* orbital component) and Zn (2*p* orbital component) are examined in 7 points of a depth direction (the upper Mo—Nb film, near Mo—Nb upper interface layer, first near ITZO interface layer, ITZO film, second near ITZO interface layer, near Mo—Nb lower interface layer and lower Mo—Nb film) using an X-ray photoelectron spectrum. The results are shown in FIGS. 13A to 13G. FIG. 13A shows the upper Mo—Nb film, FIG. 13B shows the near Mo—Nb upper interface layer, FIG. 13C shows the first near ITZO interface layer, FIG. 13D shows the ITZO film, FIG. 13E shows the second near ITZO interface layer, FIG. 13F shows the near Mo—Nb lower interface layer, FIG. 13G shows connection condition of each of the above elements in the lower Mo—Nb film.

In the upper Mo—Nb film, only Mo was detected (see FIG. 13A). In the near Al—Mo upper interface layer, Mo, In and Sn were detected (see FIG. 13B). In the first near ITZO interface layer, Mo and ITZO were detected and a slight amount of $MoO_x$ was also detected (see FIG. 13C). In the ITZO film, only ITZO was detected (see FIG. 13D). In the second near ITZO interface layer, Mo and ITZO were detected and a slight amount of $MoO_x$ was detected (see FIG. 13E). In the near Mo—Nb lower interface layer, Mo and ITZO were detected (see FIG. 13F). In the lower Mo—Nb film only Mo as detected (see FIG. 13G). Note that in FIGS. 13A to 13G, $MoO_x$ is referred to as MoO for convenience.

Figure 14:
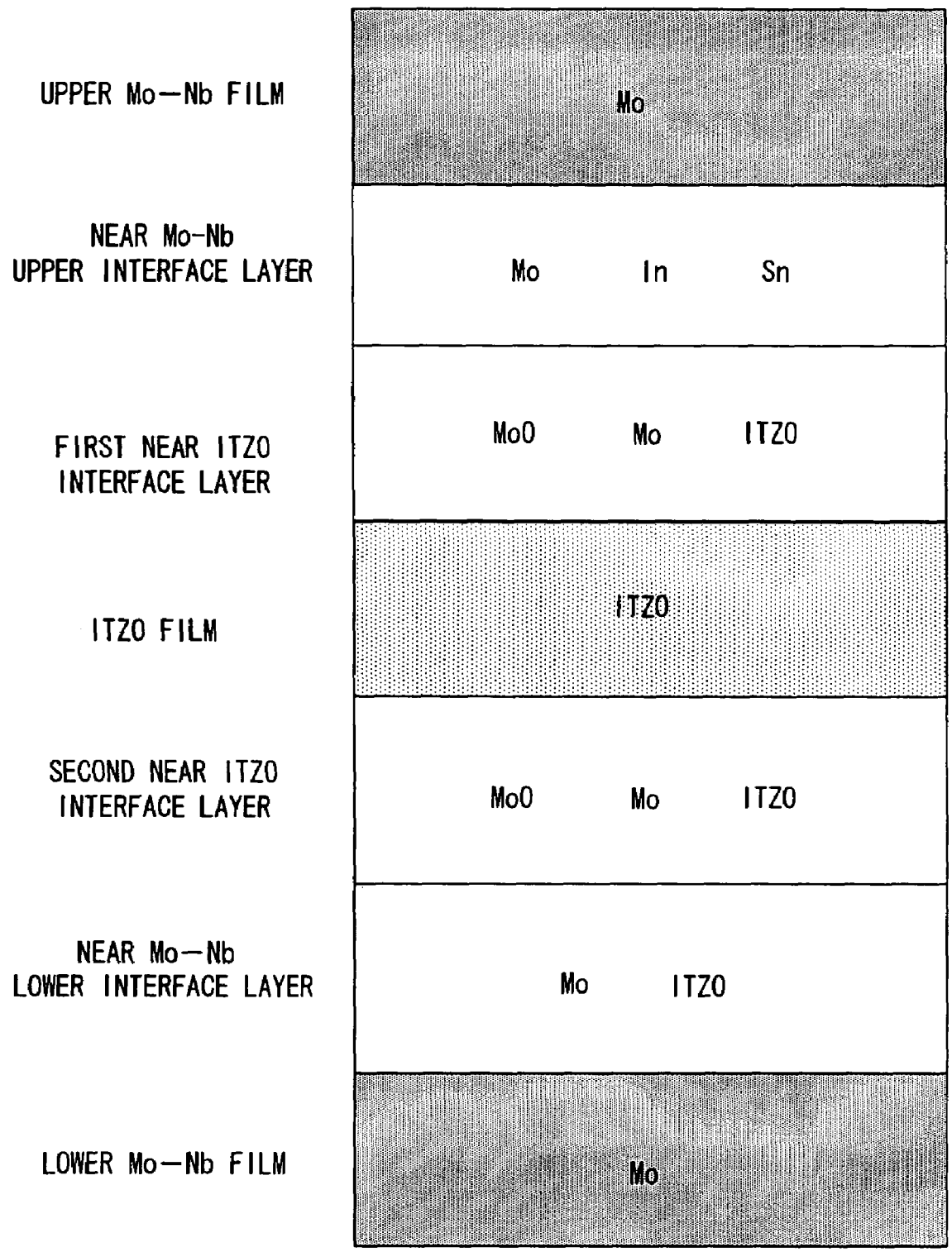
FIG. 14 schematically shows an interface structure of the Mo—Nb/ITZO/Mo—Nb laminated film according to the fifth embodiment.

FIGS. 14 schematically show the structures of the upper Mo—Nb film, near Mo—Nb upper interface layer, first near ITZO interface layer, ITZO film, second near ITZO interface layer, near Mo—Nb lower interface layer and lower Mo—Nb film from the result of FIGS. 13A to 13G. As shown in FIGS. 14, when the Mo—Nb and ITZO films contact, although $MoO_x$ which is an insulator slightly exists, Mo, ITZO, In and Sn having conductivity compose a large part. Specifically, $MoO_x$ does not exist all over the interface, and in the portion where $MoO_x$ does not exist, a conductive path is formed between the ITZO and Mo—Nb films by the above conductive material existing continuously in the depth direction of the interface layer, thus a favorable electric contact characteristic was obtained.

The cathode pixel electrode 125 of the fifth embodiment is 9 layer multilayer film laminating the Mo—Nb film which is the first cathode 125a and ITZO film which is the second cathode 125b alternately but it is not limited to this and may be 2 layers or more. The order of laminating the films may be inversed. However, to improve the efficiency of charge injection and charge transport, the ITZO film preferably contacts the electroluminescence layer 124. Further, the thickness of the ITZO and Mo—Nb alloy films are 5 nm each but not limited to this and may be set to any thickness according to required specific resistance value and light transmittance of the cathode pixel electrode 125. However, to secure high light transmittance, the thickness of the Al—Mo alloy film preferably should not exceed 10 nm.

As for the Mo—Nb alloy film which is the first cathode 125a is not limited to this and may be an Mo alloy film added with a pure Mo film or other alloying element. By adding Nb to Mo, corrosion resistance to water and moisture is improved and reliability is also improved. Other than Nb, a Mo alloy film added with Ti, Cr, W and Zr or the like as alloying element may be used. The amount of addition is preferably 0.5 to 25 mol %. If the amount is under 0.5 mol %, the corrosion resistance is not sufficient and if the amount is over 25 mol %, it is difficult to etch with chemical including phosphoric acid+nitric acid+acetic acid.

As set forth above, according to the fifth embodiment, the cathode pixel electrode 125 having both low resistance and high light transmittance can be achieved. By the lower resistance, a cathode potential that is even to the entire screen can be supplied even if the display screen size increases. Therefore, an organic field effect light emitting display unit can be achieved with a high luminous efficiency and bright display images without non-uniformity of brightness.

In the first to fifth embodiments, an ITZO film having a mass ratio of $In_2O_3:SnO_2:ZnO=89:7:4$ is used as a transparent conductive film. A molar ratio of each element in the ITZO film is In=30.8 mol %, Sn=3.6 mol %, Zn=6.0 mol % and O=59.6 mol %. Specifically, the molar ratio In/(In+Sn+Zn)=0.76, the molar ratio Sn/Zn=0.6.

The composition rate of the ITZO film of the present invention is not limited to the above composition rate. The ITZO film of the present invention is required to have high light transmittance properties. Thus $In_2O_3$ preferably has a mass ratio of 85 to 95 mass %.

Figure 15:
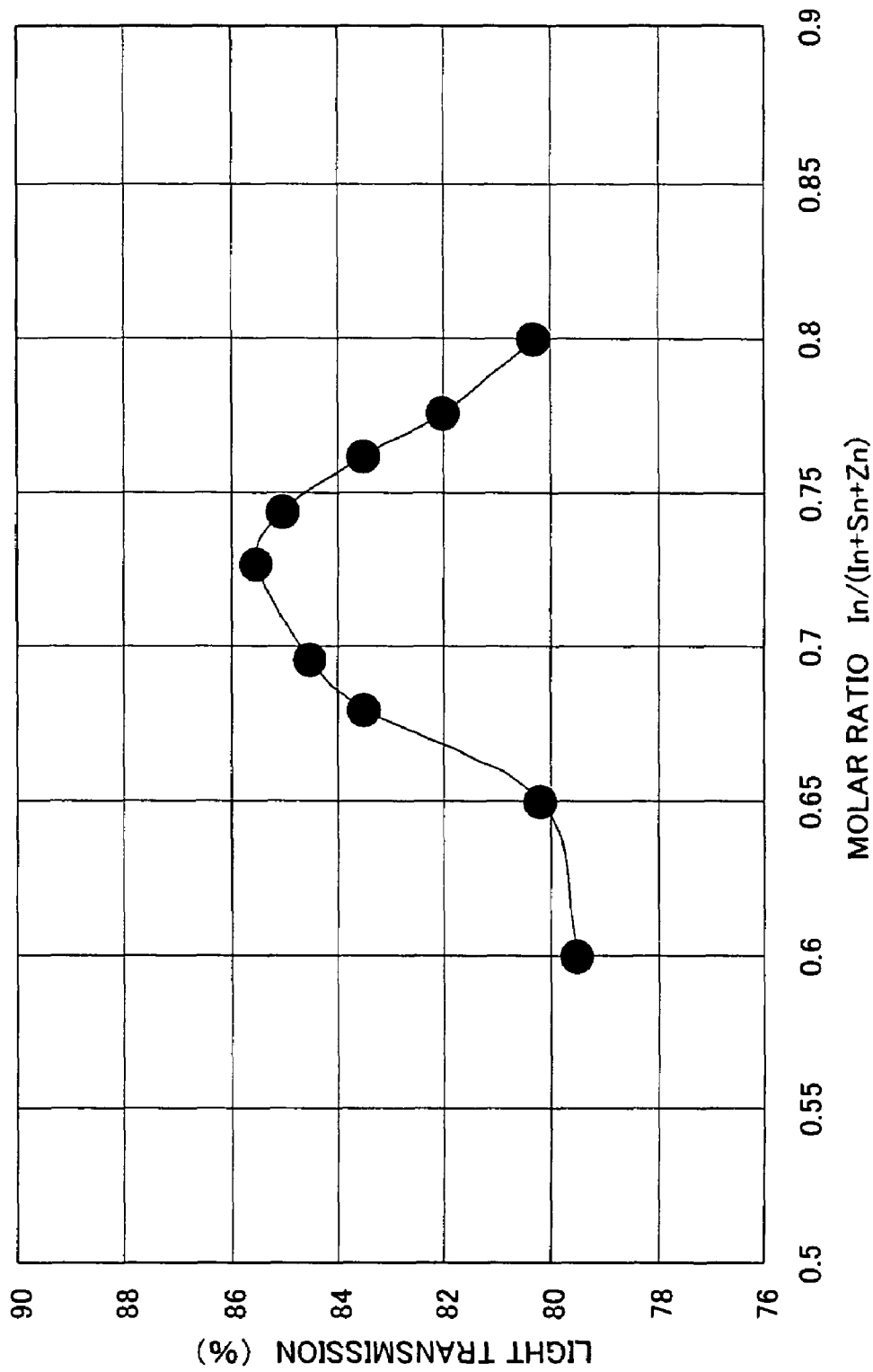
FIG. 15 is a graph showing the change in light transmittance of an ITZO film to molar ratio Sn/Zn.

Further, to optimize the composition rate of the ITZO film, light transmittance for wavelength 550 nm (green) of the ITZO film with different composition rates within the range of above mass ratio has been measured. The result is shown in FIG. 15. The horizontal axis in FIG. 15 indicates a molar ratio In/(In+Sn+Zn) and a vertical axis indicates light transmittance. The conventional IZO film has light transmittance of 80%. For the ITZO film to have more light transmittance, the molar ratio In/(In+Sn+Zn) must be in the range of 0.65 to 0.8.

Figure 16:
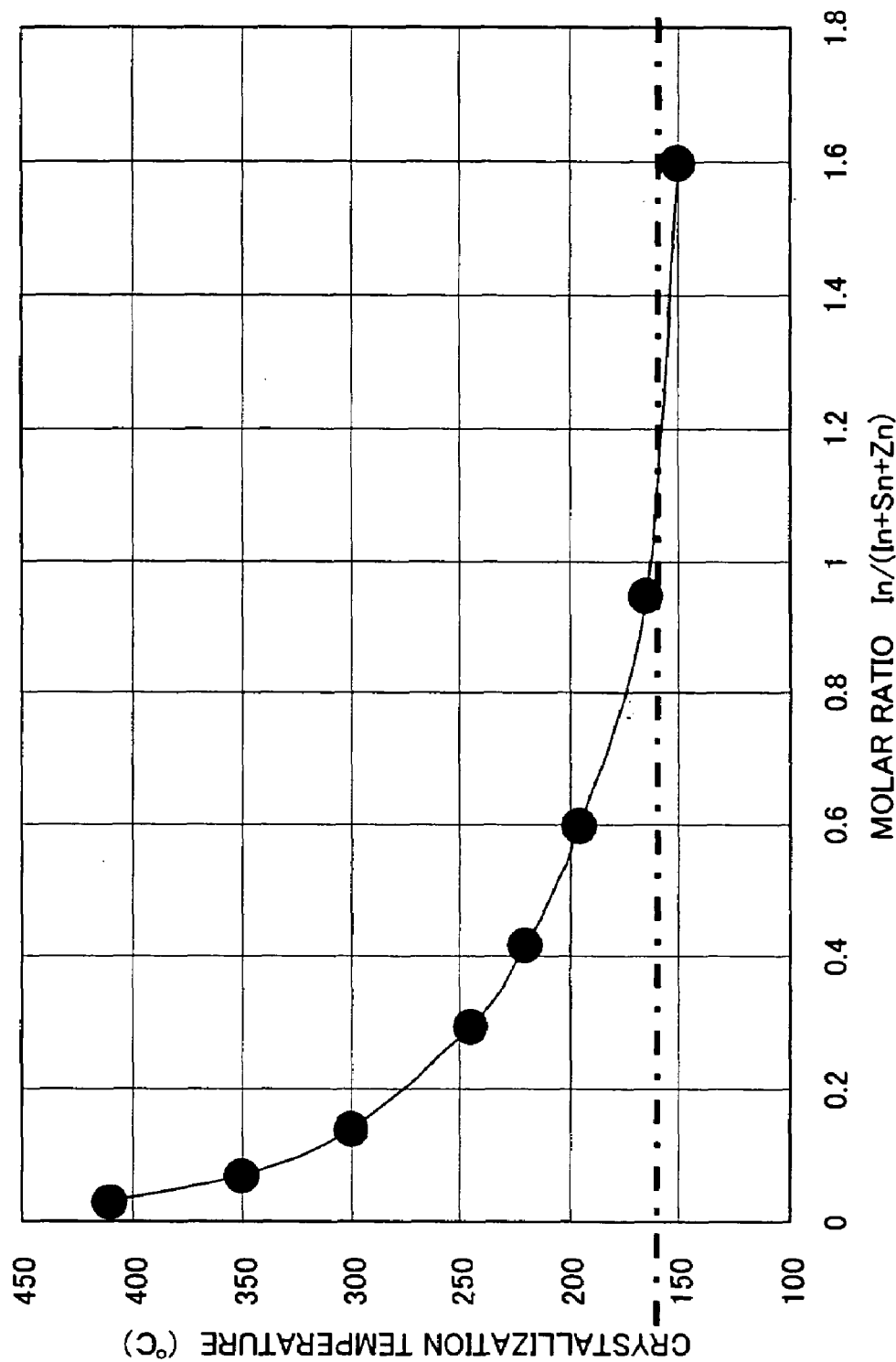
FIG. 16 is a graph showing the change in crystallization temperature of an ITZO film to molar ratio Sn/Zn.

FIG. 16 is a graph showing a dependency of a temperature that the ITZO film is changing a phase from amorphous to crystal, namely a crystallization temperature, to a molar ratio Sn/Zn. The smaller the molar ratio Sn/Zn, the crystallization temperature increases. The baking temperature of a photoresist in photolithography process is generally within the range of 90 to 160 degree Celsius. Therefore, to incorporate a semiconductor device requiring a photolithography process, an ITZO film having a composition with a crystallization temperature exceeding 160 degree Celsius, that is the molar ratio Sn/Zn is 1 or less is preferable. By using the amorphous ITZO film, the film will not be partially crystallized in photolithography process. Thus in the etching using weak acid oxalic acid, there is almost no etching residue generated. Furthermore, as seen from the depth profile of FIGS. 4, 9 and 12, in the above embodiments, the molar Sn/Zn is 1 or less until reaching near the interface with Al or Mo film from the ITZO film (meaning that strength of Zn is higher than that of Sn). Zn atom included in the ITZO film is considered to function to exist Al or In in metal state not oxide state and an ITZO film having a molar ratio Sn/Zn of 1 or less is preferably used in light of achieving a favorable electric contact properties in the interface.

On the other hand, after the etching, the ITZO film must be crystallized in order to improve corrosiveness to chemicals. As shown in FIG. 16, the ITZO film can be crystallized by performing a heat treatment by the temperature of more than crystallization temperature. However, the heat treatment temperature must be less than the heatresistant temperature of the semiconductor device. For example, for the organic field effect light emitting display unit of the second and third embodiments, it is not possible to perform a heat treatment exceeding the heat resistant temperature of the planarizing film 122 that is made from insulating resin already formed below the anode pixel electrode 117 at least after forming the anode pixel electrode 117 of the present invention. Generally the heatresistant temperature of known material for insulating resin film, it is 250 degree Celsius is at most. Heat treatment by the temperature exceeding the heatresistant temperature could cause the resin to be carbonized or thermally decomposed. Therefore the ITZO is preferably crystallized in the temperature of approx. 250 degree Celsius or less. Thus, as shown in FIG. 16, the molar ratio Sn/Zn of the ITZO film is preferably 0.3 or more.

Asset forth above, by using the ITZO film of the present invention as a transparent conductive film, an amorphous ITZO film can be manufactured by sputtering method of only Ar gas without mixing $H_2O$ or $H_2$. In the sputtering method, there is almost no dust generated thus it is able to create an even amorphous film with no foreign matters mixed. Further, in a post baking process for a resist patterning of photolithography process, the ITZO film will not be partially crystallized. Thus even in an etching using weak acid oxalate solution, there is almost no etching residue generated and favorable etching can be performed. After the etching, by performing a heat treatment of approx. 250 degree Celsius to crystallize and is stabled chemically, thus improving reliability. Furthermore, a contact resistance value with Al alloy film can be reduced.

Although the semiconductor devices according to the first to fifth embodiment is an active matrix type TFT array substrate for a liquid crystal display and organic field effect light emitting display unit, the present invention is not limited to this but may be applied to other semiconductor having a electrical connector of a metal film and transparent conductive film.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A transparent conductive film substantially made from $In_2O_3$, $SnO_2$ and ZnO, having a molar ratio In/(In+Sn+Zn) of 0.65 to 0.8 and also a molar ratio Sn/Zn of 1 or less.

2. The transparent conductive film according to claim 1, wherein the molar ratio Sn/Zn is 0.3 or more.

3. The transparent conductive film according to claim 1, wherein a crystallization temperature is in 160 to 250 degree Celsius.

4. The transparent conductive film according to claim 2, wherein a crystallization temperature is in 160 to 250 degree Celsius.

5. A semiconductor device comprising:
   the transparent conductive film according to claim 1; and
   a metal film directly contact with the transparent conductive film.

6. The semiconductor device according to claim 5, wherein the transparent conductive film and the metal film are alternately laminated for a plurality of times.

7. The semiconductor device according to claim 5, wherein the metal film includes Al as primary component.

8. The semiconductor device according to claim 5, wherein the metal film includes Mo as primary component.

9. An active matrix display unit comprising the semiconductor device according to claim 5.

* * * * *